(12) United States Patent
Yagami

(10) Patent No.: US 7,860,351 B2
(45) Date of Patent: Dec. 28, 2010

(54) SPIN-INJECTION MAGNETORESISTANCE EFFECT ELEMENT

(75) Inventor: Kojiro Yagami, Miyagi (JP)

(73) Assignee: Sony Corporation, Tokyo (JP)

(*) Notice: Subject to any disclaimer, the term of this patent is extended or adjusted under 35 U.S.C. 154(b) by 1322 days.

(21) Appl. No.: 11/276,833

(22) Filed: Mar. 16, 2006

(65) Prior Publication Data
US 2006/0227466 A1 Oct. 12, 2006

(30) Foreign Application Priority Data
Mar. 25, 2005 (JP) ............................. P2005-087950

(51) Int. Cl.
 *G06K 9/00* (2006.01)
 *G11B 5/127* (2006.01)
 *G11C 11/00* (2006.01)
 *G11C 11/14* (2006.01)

(52) U.S. Cl. .................. 382/325; 360/313; 365/158; 365/171

(58) Field of Classification Search ............ 382/320, 382/325; 360/313, 314, 315, 324.1, 324.2; 365/8, 32, 33, 48, 55, 62, 66, 74, 157, 158, 365/171, 173, 209
See application file for complete search history.

(56) References Cited

U.S. PATENT DOCUMENTS 6,081,445 A * 6/2000 Shi et al. .................... 365/158
6,714,444 B2 * 3/2004 Huai et al. .................. 365/171
6,781,872 B2 * 8/2004 Saito et al. .................. 365/158

* cited by examiner

*Primary Examiner*—Abolfazl Tabatabai
(74) *Attorney, Agent, or Firm*—SNR Denton US LLP

(57) ABSTRACT

A spin-injection magnetoresistance effect element that can avoid use of a large writing current and allows use of a large reading current. The spin-injection magnetoresistance effect element includes layers that may exhibit a tunnel magnetoresistance effect and layers that may exhibit a giant magnetoresistance effect.

11 Claims, 11 Drawing Sheets

SPIN-INJECTION MAGNETORESISTANCE EFFECT ELEMENT

CROSS REFERENCES TO RELATED APPLICATIONS

The present invention contains subject matter related to Japanese Patent Application JP 2005-087950 filed in the Japanese Patent Office on Mar. 25, 2005, the entire contents of which being incorporated herein by reference.

BACKGROUND OF THE INVENTION

The present invention relates to a spin-injection magnetoresistance effect element.

Magnetic random access memory (MRAM) has been known as a non-volatile magnetic memory element of high speed, high integration, and low power consumption (refer to U.S. Pat. No. 6,081,445, for example). The MRAM employing a tunnel magnetoresistance (TMR) effect includes tunnel magnetoresistive elements that are coupled to selection transistors formed of MOS-FETs. In addition, bit lines are provided above the tunnel magnetoresistive elements, and word lines extending perpendicularly to the bit lines are provided below the tunnel magnetoresistive elements. The tunnel magnetoresistive element has a multi-layer structure including from its bottom an antiferromagnetic layer, a magnetization fixed layer (referred to also as a pinned layer), a tunnel insulating film, and a recording layer (referred to also as a free layer) of which magnetization direction is readily rotated. In writing of information (data) to this MRAM, a current of the positive or negative direction is applied to the bit line while a current of a constant direction is applied to the writing word line. The synthetic magnetic field arising from these currents changes the magnetization direction of the recording layer, to thereby record a logical value of "1" or "0" in the recording layer.

In this MRAM employing the TMR effect, magnetization reversal is caused by a current magnetic field. However, the current amount required for this magnetization reversal increases in almost inverse proportion to the size of the tunnel magnetoresistive element. Therefore, construction of a high-capacity non-volatile magnetic memory element array involves a problem of large current consumption.

Spin-injection magnetization reversal is a novel magnetization reversal (magnetic information writing) method that does not depend on a current magnetic field and offers reduced power consumption (refer to U.S. Pat. No. 6,714,444, for example). In the spin-injection magnetization reversal, the current amount required for magnetization reversal decreases as the size of a magnetic element such as a non-volatile magnetic memory element becomes smaller. Therefore, the spin-injection magnetization reversal is suitable for achieving a high-capacity (e.g. giga-bit class) non-volatile magnetic memory element array.

FIG. 11A is a conceptual diagram of a conventional non-volatile magnetic memory element that employs spin-injection magnetization reversal. The non-volatile magnetic memory element includes a magnetoresistance effect multi-layer film having a giant magnetoresistance (GMR) effect or a TMR effect. This multi-layer film is interposed between two electrodes 401 and 405. Specifically, this multi-layer film is formed of a magnetization reversal layer (referred to also as a free layer) 404 having a function of recording information, a magnetization reference layer (referred to also as a pinned layer) 402 having a fixed magnetization direction and thus serving as a spin filter, and a nonmagnetic film 403 interposed between the layers 404 and 402. A current flows perpendicularly to the planes of these films (see FIG. 11A). FIG. 11B schematically shows the planar shape of the magnetization reversal layer 404. The size of the magnetization reversal layer 404 is typically about 200 nm or smaller in order to achieve single-domain magnetization and reduce the critical current $I_c$ of spin-injection magnetization reversal, although depending on the magnetic material and thickness of the layer 404. The magnetization reversal layer 404 can be magnetized in two or more directions (two lateral directions indicated by the arrowheads in FIG. 11A, for example) due to its adequate magnetic anisotropy. Each magnetization direction corresponds to recorded information. In the example of FIG. 11B, the magnetization reversal layer 404 is designed to have an elliptic planar shape so as to be provided with a shape magnetic anisotropy. The magnetization direction of the magnetization reference layer 402 is pinned typically by exchange coupling between the layer 402 and an antiferromagnetic layer 406 (see FIG. 11C). Additionally, a double spin filter structure is also known (see FIG. 11D). In this structure, in order to enhance the efficiency of spin-injection magnetization reversal, magnetization reference layers 402A and 402B are provided above and below the magnetization reversal layer 404 with the intermediary of nonmagnetic films 403A and 403B therebetween, respectively. This structure also includes antiferromagnetic layers 406A and 406B. In the examples of FIGS. 11A, 11C and 11D, sometimes the magnetization reversal layer 404 and the magnetization reference layer 402 (one of two magnetization reference layers 402A and 402B) are formed of a synthetic ferri-magnetic structure. The nonmagnetic films 403, 403A and 403B are composed of a metal material or an insulating material. In the examples of FIGS. 11A and 11C, sometimes another structure is also employed in which the magnetization reference layer 402 is sufficiently larger than the magnetization reversal layer 404 in order to suppress a leakage magnetic field from the layer 402 to the layer 404, in other words, in order to prevent the layers 402 and 404 from being magnetostatically coupled. In any structure, the conventional non-volatile magnetic memory element based on spin-injection magnetization reversal has a two-terminal spin transfer element structure in which a magnetoresistance effect multi-layer film is interposed between two electrodes.

In a high-capacity non-volatile magnetic memory element array of the giga-bit class, the widths of gate electrodes of CMOS-FETs for memory cell selection and various interconnects are 100 nm or smaller. The amount of current that can be applied to these gate electrodes and various interconnects is limited to about 100 μA or smaller. Therefore, when information is written to a magnetic element by spin-injection magnetization reversal, the writing current needs to be suppressed to about several tens of microamperes. Currently, however, the critical current (writing current) $I_c$ of spin-injection magnetization reversal is on the order of several hundred microamperes to several milliamperes. This large critical current is a bottleneck in practical application of spin-injection magnetization reversal to a non-volatile magnetic memory element array.

The critical current (writing current) $I_c$ of spin-injection magnetization reversal (sometimes referred to simply as the critical current $I_c$, hereinafter) depends on the time period of writing information (i.e., current pulse width). Typically, the longer the information writing time period is, the smaller the critical current $I_c$ may be. In practical MRAM, it is required that the writing time period be on the order of nanoseconds. Therefore, the following description is based on an assumption that the writing time period is one nanosecond, and the critical current $I_c$ discussed in the following description is premised on this writing time period.

If a magnetic moment fluctuates due to heat, magnetization reversal is possibly caused stochastically. Therefore, the thermal fluctuation resistance directly affects the reliability of MRAM. The thermal fluctuation resistance is expressed as the ratio of the magnetic anisotropy energy of a magnetization reversal layer to the thermal energy thereof, $(K_u \cdot V/k_B \cdot T)$. $K_u$ denotes the magnetic anisotropy energy per unit volume of a magnetization reversal layer. V denotes the volume of the magnetization reversal layer. $k_B$ denotes the Boltzmann constant. T denotes the absolute temperature of the magnetization reversal layer. Typically, the thermal fluctuation resistance needs to satisfy the relationship $(K_u \cdot V/k_B \cdot T) > 40$. The probability of thermal magnetization reversal is expressed by the Boltzmann distribution $\exp(-K_u \cdot V/k_B \cdot T)$. The time period $\tau$ of the occurrence of thermal magnetization reversal is expressed by the equation $\ln(\tau/\tau_0) = K_u \cdot V/k_B \cdot T$. $\tau_0$ denotes the reversal trial time period (time period of one trial of magnetization reversal), and is about one nanosecond.

The basic configuration of a magnetic element (the structure of a multi-layer film) is based on a magnetoresistance effect film. The magnetoresistance effect film is formed of two magnetic films (a magnetization reversal layer and a magnetization reference layer) that are deposited with the intermediary of a nonmagnetic film therebetween. The magnetoresistance effect film is a multi-layer structure having a GMR effect when the nonmagnetic film is an electrically conductive film, while it is a multi-layer structure having a TMR effect when the nonmagnetic film is an insulating film. The magnetization reversal layer has a low resistance when the magnetization directions of two magnetic layers, in other words, the magnetization reversal layer and the magnetization reference layer, are parallel. In contrast, the magnetization reversal layer has a high resistance when the magnetization directions are antiparallel. This phenomenon (magnetoresistance effect) is used to record magnetic information of "0" or "1" in the magnetic element. Subsequently, an adequate current is passed through the magnetization reversal layer to thereby detect the resistance of the magnetization reversal layer, which allows nondestructive retrieval of the magnetic information recorded in the magnetization reversal layer. In a memory element, it is desirable to use a multilayer structure having a TMR effect, which offers larger outputs.

SUMMARY OF THE INVENTION

Conventional techniques have employed various features for reducing the critical current $I_c$. However, these features cause other problems: lowering of the thermal fluctuation resistance; an increase of the reversal time period; and a complicated multi-layer structure of a magnetic element. Furthermore, when a magnetic element employs spin-injection magnetization reversal for writing information, a small current difference between the writing current and reading current leads to a possibility that the magnetization direction of the magnetization reversal layer is erroneously reversed at the time of reading information. Therefore, in order to prevent this erroneous writing when magnetic information is read out in a magnetic element, it is required that the reading current be suppressed to few tenths of the writing current (to about 10 µA). The suppression of the reading current however results in a small difference between output voltages from the magnetic element, corresponding to magnetic information of "0" and "1," respectively (the difference is equivalent to the product between the resistance change of the magnetization reversal layer and the reading current). As a result, it is difficult to obtain a high S/N ratio.

An object of the present invention therefore is to provide a spin-injection magnetoresistance effect element that can eliminate a conventional problem that the critical current $I_c$ of spin-injection magnetization reversal has a high current value on the order of several hundred microamperes to several milliamperes, and allows use of a large reading current.

In order to achieve the above-described object, a spin-injection magnetoresistance effect element according to one embodiment of the present invention includes (A) a magnetization reversal layer that has a first face and a second face opposite to the first face, and stores information, (B) a first magnetization reference layer (referred to also as a pinned layer) that is disposed near one end of the magnetization reversal layer in a manner of facing the first face of the magnetization reversal layer with intermediary of a first nonmagnetic film between the first magnetization reference layer and the magnetization reversal layer, and is magnetized in a first direction, (C) a second magnetization reference layer that is disposed near the other end of the magnetization reversal layer in a manner of facing the first face of the magnetization reversal layer and being separated from the first magnetization reference layer with intermediary of a second nonmagnetic film between the second magnetization reference layer and the magnetization reversal layer, and is magnetized in a second direction that is the opposite direction of the first direction, (D) a first electrode that is electrically coupled to the first magnetization reference layer, (E) a second electrode that is electrically coupled to the second magnetization reference layer, and (F) a third electrode that is disposed in a manner of facing the second face of the magnetization reversal layer with intermediary of an insulating film between the third electrode and the magnetization reversal layer. That is, a spin-injection magnetoresistance effect element according to one embodiment of the invention has a three-terminal spin transfer element structure.

In the spin-injection magnetoresistance effect element, the first magnetization reference layer, the first nonmagnetic film and the magnetization reversal layer may form a multi-layer structure having a tunnel magnetoresistance (TMR) effect. In addition, the second magnetization reference layer, the second nonmagnetic film and the magnetization reversal layer may form, although not limited to, a multi-layer structure having a giant magnetoresistance (GMR) effect.

Furthermore, in the spin-injection magnetoresistance effect element, a first antiferromagnetic layer may be formed between the first magnetization reference layer and the first electrode, and a second antiferromagnetic layer may be formed between the second magnetization reference layer and the second electrode. Alternatively, either one of the first and second magnetization reference layers may have a synthetic ferri-magnetic structure. Further alternatively, either one of the first and second magnetization reference layers may have a magnetostatically coupled structure. Yet further alternatively, the first magnetization reference layer may have a synthetic ferri-magnetic structure, and the second magnetization reference layer have a synthetic ferro-magnetic structure.

The multi-layer structure that is formed of the first magnetization reference layer, the first nonmagnetic film and the magnetization reversal layer, and has a TMR effect is equivalent to a structure in which the first nonmagnetic film serving as a tunnel insulating film is interposed between the first magnetization reference layer composed of a magnetic material and the magnetization reversal layer composed of a magnetic material. The multi-layer structure that is formed of the second magnetization reference layer, the second nonmagnetic film and the magnetization reversal layer, and has a GMR effect is equivalent to a structure in which the second nonmagnetic film composed of a conductive material is interposed between the second magnetization reference layer composed of a magnetic material and the magnetization reversal layer composed of a magnetic material.

The term synthetic ferri-magnetic structure indicates a structure that has a three-layer structure of a magnetic material layer, a ruthenium (Ru) layer, and a magnetic material layer, and in which interlayer exchange coupling between two magnetic material layers is antiferromagnetic coupling, for example. A structure that has a similar multi-layer structure, and in which interlayer exchange coupling between two magnetic material layers is ferromagnetic coupling is referred to as the synthetic ferro-magnetic structure. The thickness of the ruthenium layer determines whether antiferromagnetic or ferromagnetic coupling the interlayer exchange coupling is. In addition, referred to as the magnetostatically coupled structure is a structure in which two magnetic material layers are antiferromagnetically coupled due to leakage magnetic fields from end faces of the magnetic material layers.

Examples of materials of the magnetization reversal layer, the first magnetization reference layer and the second magnetization reference layer include following substances: ferromagnetic materials such as nickel (Ni), iron (Fe) and cobalt (Co); alloys of these ferromagnetic materials (e.g. Co—Fe, Co—Fe—Ni, and Ni—Fe); and alloys (e.g. Co—Fe—B) obtained by mixing into these alloys any of nonmagnetic elements (e.g. tantalum, boron, chromium, platinum, silicon, carbon, and nitrogen); oxides containing at least one of Co, Fe and Ni (e.g. ferrites such as Fe—MnO); a group of intermetallic compounds called half-metallic ferromagnetic materials (Huesler alloys such as NiMnSb, $Co_2MnGe$, $Co_2MnSi$ and $Co_2CrAl$); and oxides (e.g. (La, Sr)$MnO_3$, $CrO_2$, and $Fe_3O_4$). The magnetization reversal layer, the first magnetization reference layer and the second magnetization reference layer may have any crystallinity essentially, and any of a polycrystalline layer, single-crystal layer and amorphous layer is available. Moreover, any of various magnetic semiconductor materials may be used. In addition, either material of a soft magnetic material (soft film) and a hard magnetic material (hard film) may be used.

Examples of material of the first nonmagnetic film in a multi-layer structure with a TMR effect include the following substances: aluminum oxides ($AlO_x$); an aluminum nitride (AlN), a magnesium oxide (MgO); magnesium nitrides, silicon oxides; silicon nitrides; and insulating materials such as $TiO_2$, $Cr_2O_3$, Ge, NiO, $CdO_x$, $HfO_2$, $Ta_2O_5$, BN, and ZnS. Examples of material of the second nonmagnetic film in a multi-layer structure with a GMR effect include conductive materials such as Cu, Ru, Cr, Au, Ag, Pt, Ta and alloys of these metals. Alternatively, any non-metal material is also available as long as the material has high conductivity (resistivity lower than several hundred micro-ohm centimeters). It however is desirable to adequately select a material that hardly causes interfacial reaction with the magnetization reversal layer and the second magnetization reference layer. Note that the multi-layer structure formed of the second magnetization reference layer, the second nonmagnetic film and the magnetization reversal layer does not necessarily need to exhibit a GMR effect. Examples of material of the insulating film include insulating materials such as aluminum oxides ($AlO_x$), an aluminum nitride (AlN), a magnesium oxide (MgO), magnesium nitrides, silicon oxides, silicon nitrides, $TiO_2$ and $Cr_2O_3$, and ferroelectric materials such as $BaTiO_3$ (barium titanate, having a dielectric constant of about 2900), $SrTiO_3$ and $PbTiO_3$. A material having a higher dielectric constant can store a larger amount of electrostatic energy, and therefore offers a higher effect of weakening the in-plane magnetic anisotropy in the magnetization reversal layer due to voltage application to the third electrode. Therefore, a ferroelectric material is a preferable insulating material in terms of reduction of the writing current (i.e., the critical current of spin-injection magnetization reversal) with use of voltage assist.

The first, second and third electrodes are formed of a single-layer film composed of Cu, Au, Pt or the like. Alternatively, these electrodes are composed of a multi-layer film including an underlayer made of Cr, Ti or the like and an upper layer formed thereon made of Cu, Au, Pt or the like. Examples of materials of the first and second antiferromagnetic layers include iron-manganese alloys, nickel-manganese alloys, platinum-manganese alloys, iridium-manganese alloys, rhodium-manganese alloys, cobalt oxides and nickel oxides. Examples of form of electrical coupling between the first magnetization reference layer and the first electrode are as follows: the first electrode is directly connected to the first magnetization reference layer; and the first electrode is coupled via the first antiferromagnetic layer to the first magnetization reference layer. Similarly, examples of form of electrical coupling between the second magnetization reference layer and the second electrode are as follows: the second electrode is directly connected to the second magnetization reference layer; and the second electrode is coupled via the second antiferromagnetic layer to the second magnetization reference layer. An underlayer film composed of Ta, Cr, Ti or the like may be formed between the first electrode and the first antiferromagnetic layer, and between the second electrode and the second antiferromagnetic layer, in order to improve the crystallinity of the first and second antiferromagnetic layers.

These layers can be formed by physical vapor deposition typified by sputtering, ion-beam deposition and vacuum deposition, or chemical vapor deposition typified by atomic layer deposition.

The first nonmagnetic film can be obtained by oxidizing or nitriding a metal film formed by sputtering for example. More specifically, when an aluminum oxide ($AlO_x$) is used as the insulating material of the first nonmagnetic film, any of the following methods is available for example: a method of oxidizing in an air atmosphere an aluminum film formed by sputtering; a method of plasma-oxidizing an aluminum film formed by sputtering; a method of oxidizing with IPC plasma an aluminum film formed by sputtering; a method of naturally oxidizing in an oxygen atmosphere an aluminum film formed by sputtering; a method of oxidizing with oxygen radical an aluminum film formed by sputtering; a method of naturally oxidizing in an oxygen atmosphere an aluminum film formed by sputtering in association with irradiation of the film with ultra-violet rays; a method of depositing an aluminum film by reactive sputtering; and a method of depositing an aluminum oxide ($AlO_x$) film by sputtering.

Examples of applications of the spin-injection magnetoresistance effect element according to one embodiment of the invention include MRAM, current sensors and voltage sensors.

The spin-injection magnetoresistance effect element according to one embodiment of the invention has a three-terminal spin transfer element structure unlike a conventional spin-injection magnetoresistance effect element having a two-terminal spin transfer element structure. If a voltage is applied to the third electrode when information is written to the magnetization reversal layer, electron distribution in the vicinity of the interface between the magnetization reversal layer and insulating film changes. Thus, induced in the magnetization reversal layer near the interface to the insulating film is the magnetic anisotropy in the perpendicular-to-plane direction (the thickness direction of the magnetization reversal layer, in other words, the Z-axis direction, hereinafter indicating the same direction), which therefore weakens the magnetic anisotropy (in-plane magnetic anisotropy) of the magnetization reversal layer in the in-plane direction (the direction perpendicular to the thickness direction of the magnetization reversal layer, in other words, the X-Y-axis direction, hereinafter indicating the same direction). Accordingly, the writing current (i.e., the critical current of spin-injection magnetization reversal) can be reduced to several tens of microamperes or smaller, for the writing time period on the order of nanoseconds. Thus, a non-volatile magnetic memory element array of ultra-low power consumption, high speed, and high capacity (over the giga-bit class) can be achieved. In addition, there is no need to suppress the reading current to few tenths of the writing current (to about 10 µA) in order to prevent erroneous writing at the time of retrieving magnetic information, and the reading current amount can be determined independently of the writing current amount. Thus, use of a large reading current is allowed.

DETAILED DESCRIPTION OF THE PREFERRED EMBODIMENTS

Embodiments of the present invention will be described below with reference to the accompanying drawings.

First Embodiment

Figure 1A:
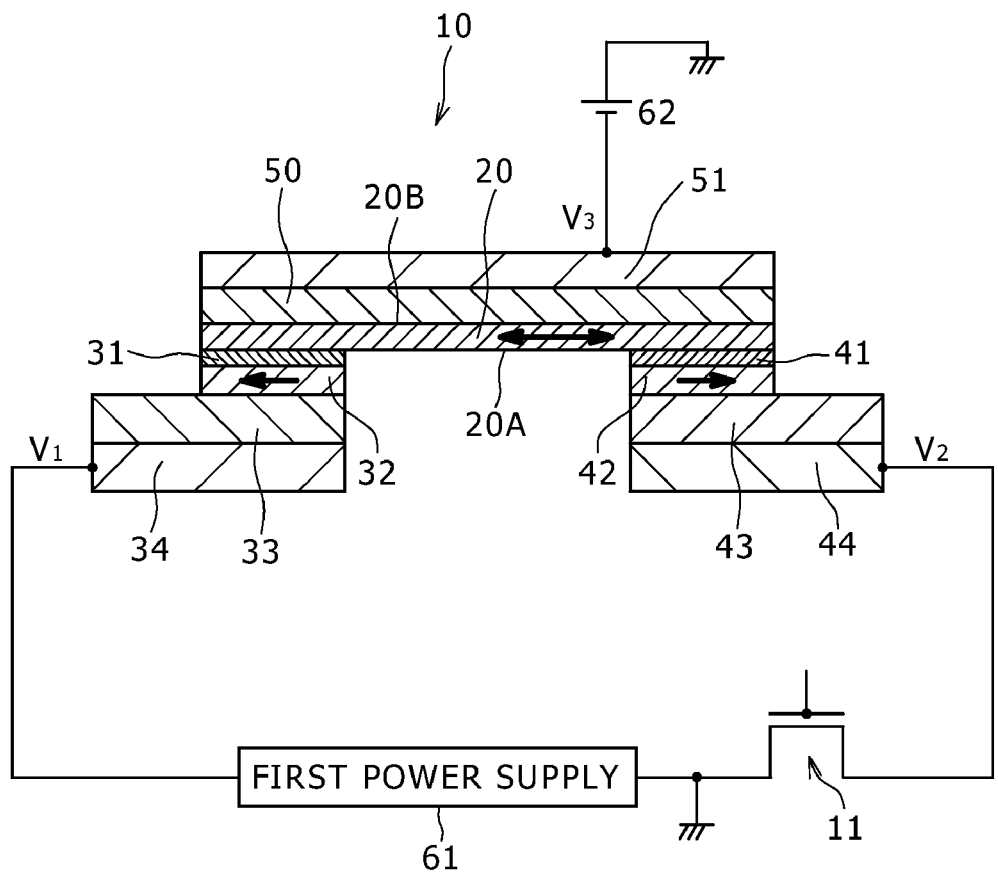
FIG. 1A is a conceptual diagram illustrating a spin-injection magnetoresistance effect element according to a first embodiment of the present invention.
Figure 1B:
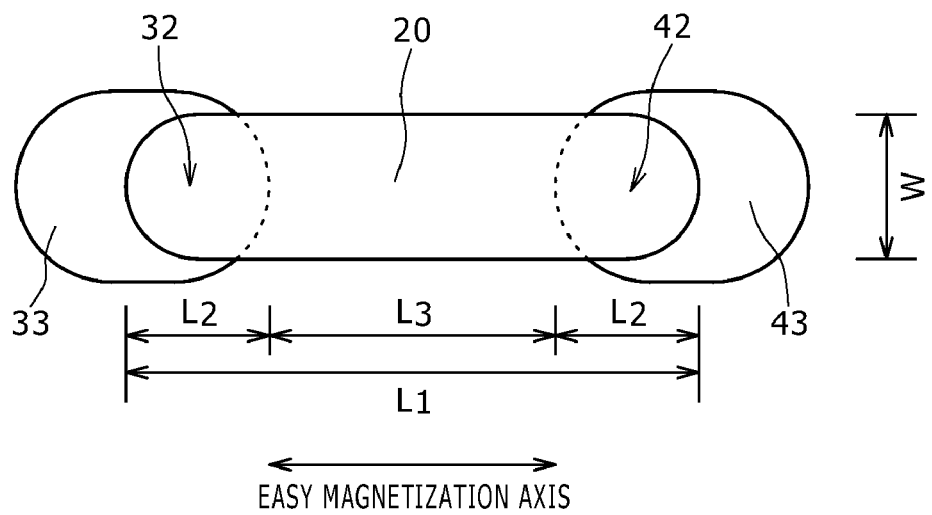
FIG. 1B is a schematic diagram showing the arrangement of a magnetization reversal layer, a first magnetization reference layer and a second magnetization reference layer.
Figure 2:
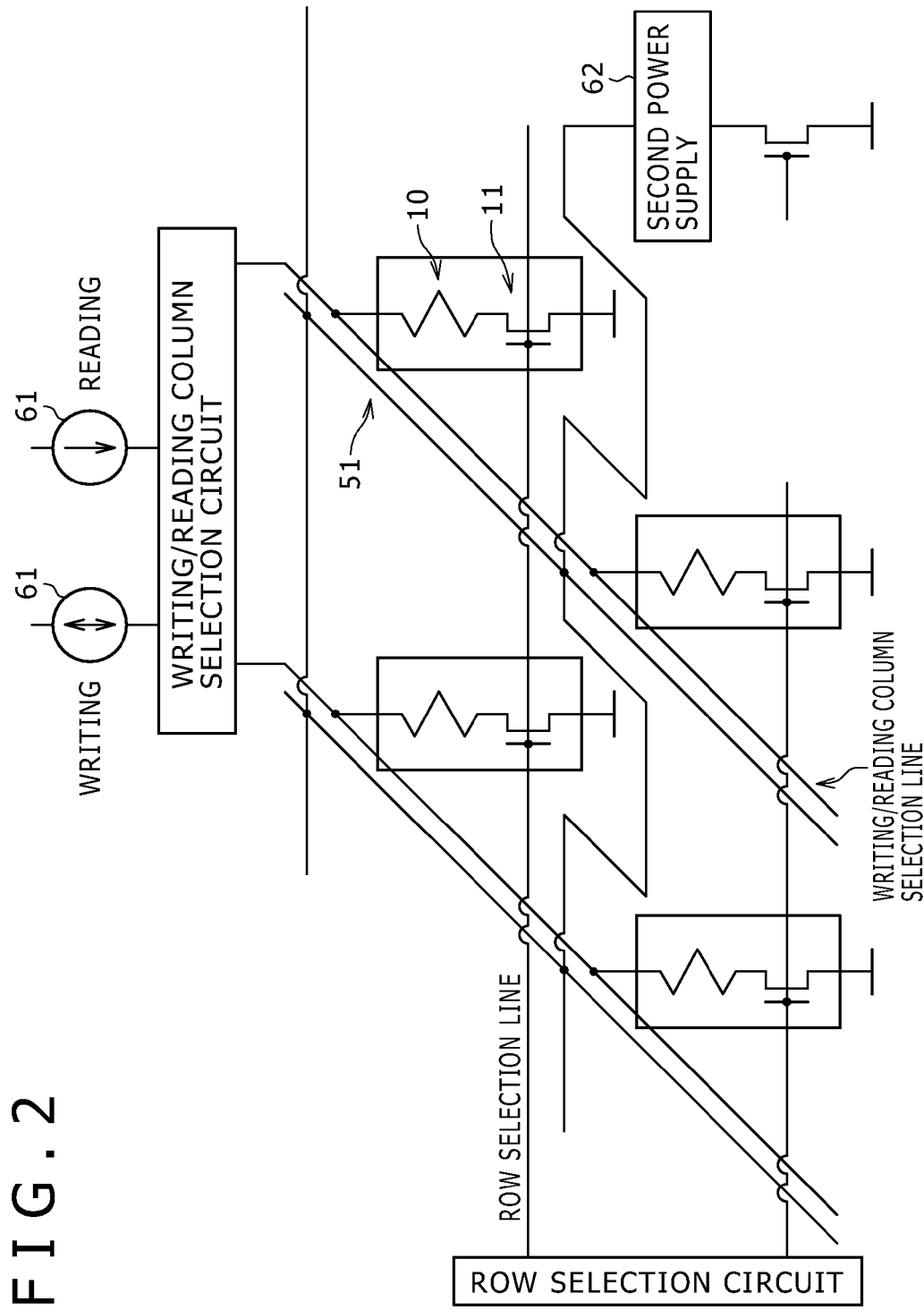
FIG. 2 shows an equivalent circuit of MRAM including the spin-injection magnetoresistance effect element of the first embodiment.
Figure 3:
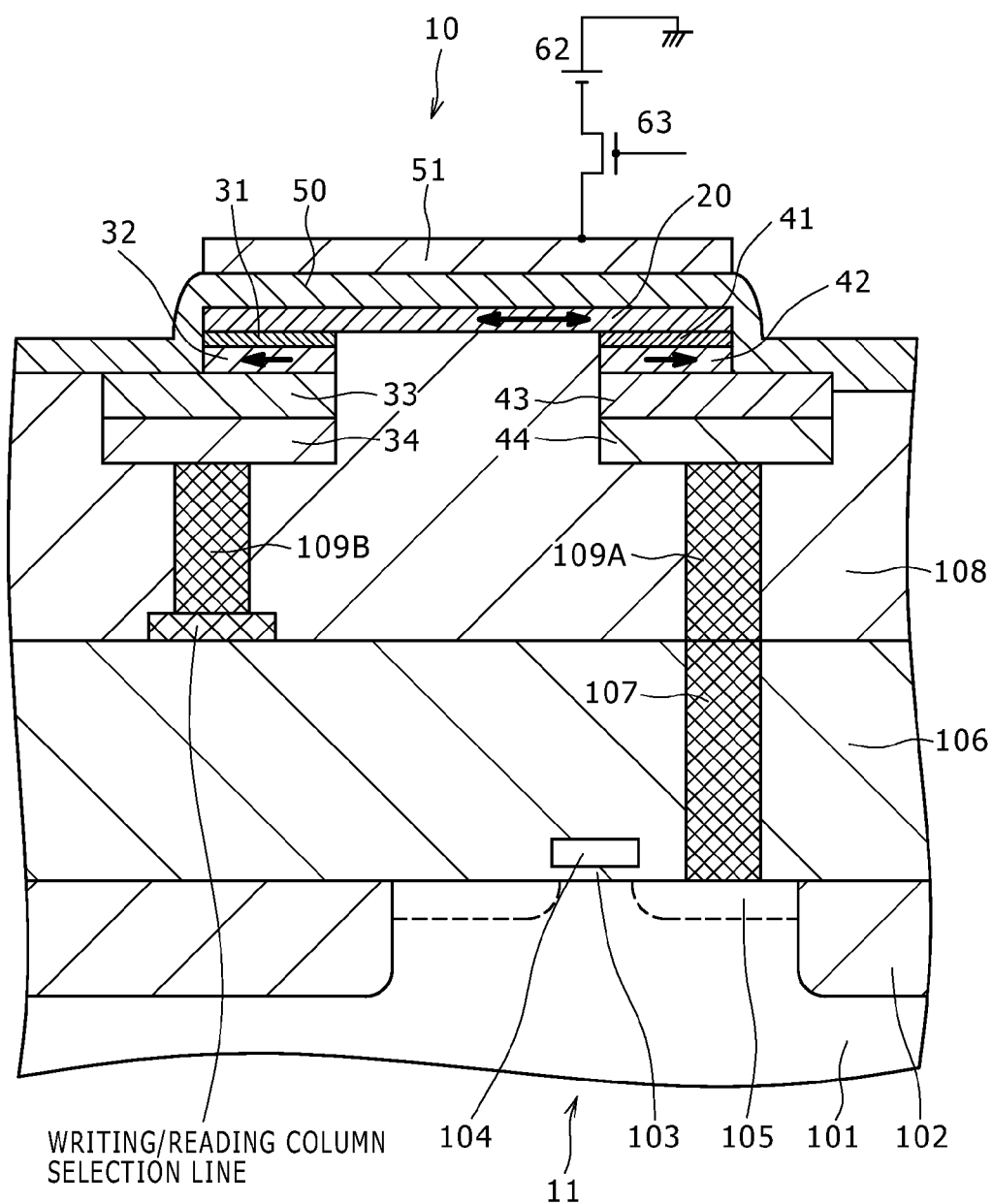
FIG. 3 is a sectional view schematically illustrating part of the MRAM including the spin-injection magnetoresistance effect element of the first embodiment.

A first embodiment of the present invention relates to a spin-injection magnetoresistance effect element, and more specifically to a spin-injection magnetoresistance effect element applied to MRAM. A spin-injection magnetoresistance effect element 10 according to the first embodiment has a three-terminal spin transfer element structure that is referred to also as a voltage-assisted spin-injection magnetization reversal structure. FIG. 1A is a conceptual diagram illustrating the element 10. FIG. 1B is a schematic diagram illustrating the arrangement of a magnetization reversal layer, a first magnetization reference layer and a second magnetization reference layer in the element 10. FIG. 2 illustrates an equivalent circuit of the MRAM. FIG. 3 is a schematic sectional view illustrating part of the MRAM. Turning now to FIG. 1A, the spin-injection magnetoresistance effect element 10 includes (A) a magnetization reversal layer (referred to also as a free layer) 20 that has a first face 20A and a second face 20B opposite to the first face 20A, and stores information, (B) a first magnetization reference layer (referred to also a pinned layer) 32 that is disposed near one end of the magnetization reversal layer 20 in a manner of facing the first face 20A of the layer 20 with the intermediary of a first nonmagnetic film 31 between the layers 20 and 32, and is magnetized in a first direction (in the first embodiment, in the left direction as seen in FIG. 1A), (C) a second magnetization reference layer 42 that is disposed near the other end of the magnetization reversal layer 20 in a manner of facing the first face 20A of the layer 20 and being separated from the first magnetization reference layer 32 with the intermediary of a second nonmagnetic film 41 between the layers 20 and 42, and is magnetized in a second direction (in the first embodiment, in the right direction as seen in FIG. 1A) that is the opposite direction of the first direction, (D) a first electrode 34 that is electrically coupled to the first magnetization reference layer 32, (E) a second electrode 44 that is electrically coupled to the second magnetization reference layer 42, and (F) a third electrode 51 that is disposed in a manner of facing the second face 20B of the magnetization reversal layer 20 with the intermediary of a nonmagnetic insulating film 50 between the electrode 51 and the layer 20.

The spin-injection magnetoresistance effect element 10 is a memory device that stores one bit of data. The second electrode 44 (or the first electrode 34 in some cases) included in the spin-injection magnetoresistance effect element 10 is coupled to a selection transistor 11.

Referring to FIG. 3, the selection transistor 11 is formed on a silicon semiconductor substrate 101, and includes a gate electrode 104 and a source/drain region 105. In FIG. 3, reference numerals 102 and 103 indicate an element isolation region and a gate insulating film, respectively. The gate electrode 104 is coupled to a row selection line. The selection transistor 11 is covered by a lower interlayer insulating film 106 and an upper interlayer insulating film 108. Formed on the lower interlayer insulating film 106 is a writing/reading column selection line coupled to a writing/reading column selection circuit. One of the source and drain regions 105 of the selection transistor 11 is coupled via contact plugs 107 and 109A to the second electrode 44. The writing/reading column selection line is coupled via a contact plug 109B to the first electrode 34.

The first magnetization reference layer 32 and the second magnetization reference layer 42 (sometimes generically referred to as the magnetization reference layers 32 and 42, hereinafter) have a function as an injection source of a spin-polarized current (spin filter). A first antiferromagnetic layer 33 for pinning the magnetization of the first magnetization reference layer 32 is provided in contact with the first magnetization reference layer 32. In addition, a second antiferromagnetic layer 43 for pinning the magnetization of the second magnetization reference layer 42 is provided in contact with the second magnetization reference layer 42. The first electrode 34 is in contact with the first antiferromagnetic layer 33, and the second electrode 44 is in contact with the second antiferromagnetic layer 43. However, the first electrode 34 can be positioned at any position as long as it can apply a current to the first magnetization reference layer 32, and the second electrode 44 can be positioned at any position as long as it can apply a current to the second magnetization reference layer 42. For example, the first and second electrodes 34 and 44 may be provided in contact with the first and second magnetization reference layers 32 and 42, respectively.

In the first embodiment, from the first electrode 34 via the first magnetization reference layer 32, or from the second electrode 44 via the second magnetization reference layer 42, a spin-polarized current is injected into the magnetization reversal layer 20. Thus, the magnetization direction in the magnetization reversal layer 20 is set to the first direction or second direction, which writes information in the magnetization reversal layer 20. That is, writing of information to the magnetization reversal layer 20 (magnetization reversal) is implemented based on spin-injection magnetization reversal. The direction of current flowing between the first and second electrodes 34 and 44 determines the logical value of information written to the magnetization reversal layer 20. The easy magnetization axis of the magnetization reversal layer 20 corresponds with the longitudinal direction of the magnetization reversal layer 20.

Specifically, the selection transistor 11 is selected by the row selection circuit, and thus the selection transistor 11 enters the conductive state. In addition, electrons are injected from a first power supply 61 via the writing/reading column selection circuit to the first magnetization reference layer 32 (or the second magnetization reference layer 42). The injected electrons are subjected to spin polarization in the first magnetization reference layer 32 (or the second magnetization reference layer 42) serving as a spin filter. Thus, the spin-polarized electrons flow into the magnetization reversal layer 20 as a spin-polarized current. Due to interaction between conduction electrons (s-electrons) and d-electrons in the magnetization reversal layer 20 (sd-interaction), spin torque arises in the magnetic moment, and serves as a driving force for magnetization reversal. The spin torque in the magnetization reversal layer 20 is generated near the interface between the magnetization reversal layer 20 and the first magnetization reference layer 32 (or near the interface between the magnetization reversal layer 20 and the second magnetization reference layer 42). The spin torque reverses a magnetization in the magnetization reversal layer 20 above the first magnetization reference layer 32 (or the second magnetization reference layer 42), which produces a magnetic domain wall in the magnetization reversal layer 20. This domain wall is pushed and moved by the spin-polarized current injected from the first magnetization reference layer 32 (or the second magnetization reference layer 42) to the magnetization reversal layer 20. Thus, the whole magnetization in the magnetization reversal layer 20 is reversed eventually. When electrons flow from the first magnetization reference layer 32 (or the second magnetization reference layer 42) to the magnetization reversal layer 20, the magnetization direction of the magnetization reversal layer 20 becomes parallel to the magnetization direction of the second magnetization reference layer 42 (or the first magnetization reference layer 32). Therefore, if the magnetization direction of the first magnetization reference layer 32 is set opposite (antiparallel) to that of the second magnetization reference layer 42, magnetization reversal is allowed by a change of the direction of a current applied between the first and second electrodes 34 and 44. One example of combinations of voltages $V_1$ and $V_2$ applied to the first and second electrodes 34 and 44, respectively, is as follows: $V_1=+1$ V and $V_2=0$ V; and $V_1=-1$ V and $V_2=0$ V.

In addition, in writing of information to the magnetization reversal layer 20, application of a voltage to the third electrode 51 allows control of a magnetic anisotropy in the magnetization reversal layer 20, and thus can reduce the writing current (the critical current $I_c$ of spin-injection magnetization reversal).

Specifically, when information is written to the magnetization reversal layer 20, an adequate voltage (e.g. −1 V) is applied from a second power supply 62 to the third electrode 51. The magnetization reversal layer 20 is grounded. Specifically, the magnetization reversal layer 20 is grounded via any of the conductive second nonmagnetic film 41, the second magnetization reference layer 42, the second antiferromagnetic layer 43, and the second electrode 44. Any of these layers and films may be grounded. The voltage application to the third electrode 51 applies a uniform electric field, in the direction perpendicular to the film planes, via the nonmagnetic insulating film 50 to the magnetization reversal layer 20 near the interface between the magnetization reversal layer 20 and the insulating film 50. As a result, electron distribution near the interface between the magnetization reversal layer 20 and the insulating film 50 changes, and therefore a magnetic anisotropy in the perpendicular-to-plane direction is induced in the magnetization reversal layer 20 near the interface, which weakens the in-plane magnetic anisotropy in the magnetization reversal layer 20. Consequently, the writing current (i.e., the critical current $I_c$ of spin-injection magnetization reversal) can be decreased to several tens of microamperes or smaller, for the writing time period on the order of nanoseconds. Thus, an MRAM array of ultra-low power consumption, high speed, and high capacity (over the giga-bit class) can be achieved. If no voltage is applied to the third electrode 51 at the time of information writing to the magnetization reversal layer 20, the writing current (i.e., the critical current $I'_c$ of spin-injection magnetization reversal) is on the order of several hundred microamperes to several milliamperes.

Passing a current between the first and second electrodes 34 and 44 allows the retrieval of information stored in the magnetization reversal layer 20. Specifically, the selection transistor 11 is selected by the row selection circuit, and thus the selection transistor 11 enters the conductive state. In addition, a current is applied from the first power supply 61 via the writing/reading column selection circuit between the first and second electrodes 34 and 44. Thus, a change of the resistance between the first and second electrodes 34 and 44 associated with a magnetization direction change of the magnetization reversal layer 20 is measured based on a potential change of the writing/reading column selection line. This measurement allows a determination as to whether "0" or "1" the information recorded in the magnetization reversal layer 20 is.

In the spin-injection magnetoresistance effect element 10 of the first embodiment, the writing current when no voltage is applied to the third electrode 51 (the critical current $I'_c$ of spin-injection magnetization reversal) is sufficiently large (several hundred microamperes to several milliamperes). Therefore, there is no limitation on the magnitude of the reading current $I_r$ virtually, which allows the reading current $I_r$ to be set sufficiently large. The reading current $I_r$ can be equalized to the writing current $I_c$, or alternatively can be set larger than the writing current $I_c$. Specifically, the upper limit of the reading current $I_r$ is the critical current $I'_c$, which is the critical current when no voltage is applied to the third electrode 51. In conventional techniques, reduction of the writing current inevitably involves the need to correspondingly decrease the reading current. In contrast, such a restriction does not exist in embodiments of the present invention. Moreover, erroneous writing at the time of reading information is eliminated. Thus, the magnitude of outputs and S/N ratio are enhanced, which can ensure a low error rate required in a high-capacity storage device over the giga-bit class.

As described above, the provision of the third electrode 51 enables reading and writing currents to be controlled independently of each other. For example, reading and writing currents can be set to the same value. The equalization of the reading and writing currents can simplify control circuitry (drive circuitry) and control logic circuitry in the spin-injection magnetoresistance effect element 10, and can reduce the area of the circuitry. As a result, peripheral circuitry can be reduced and the area occupation ratio of memory part to the entire chip can be increased, which contributes to increasing capacity. In addition, since there is no need to decrease the reading current to few tenths of the writing current unlike conventional techniques, high outputs can be obtained. It is desirable in terms of signal outputs that the reading current is large. The allowable maximum amount of a current passed between the first and second electrodes 34 and 44 is defined by the lower of two voltages: the breakdown voltage of the selection transistor 11; and the insulation breakdown voltage of the first nonmagnetic film 31, which is an insulating barrier film. In step with reduction of interconnect width associated with capacity increase over the giga-bit class, the widths of the gate electrodes 104 of the selection transistors 11 and various interconnects become about 100 nm recently. For this width, the allowable maximum current corresponding to the breakdown voltage of the selection transistor 11 is 100 µA. In order to satisfy the above-described conditions, the first embodiment sets both the writing and reading currents to 50 µA.

In addition, since a small writing current (the critical current $I_c$ of spin-injection magnetization reversal) can be used, there is no need to excessively reduce the writing current when no voltage is applied to the third electrode 51 (the critical current $I'_c$ of spin-injection magnetization reversal). As a result, the flexibility of design of the spin-injection magnetoresistance effect element can be enhanced. Specifically, there is no need to excessively reduce the volume V and the saturation magnetization $M_s$ (the magnetic moment per unit voltage of the magnetization reversal layer 20) of the magnetization reversal layer 20. Therefore, lowering of the thermal fluctuation resistance due to an attempt to excessively reduce the critical current $I'_c$ can surely be avoided. Furthermore, the flexibility of selecting the material of the magnetization reversal layer 20 is enhanced, and use of for example, a magnetic material with a high saturation magnetization $M_s$ is allowed. Moreover, fabrication of a complicated multi-layer structure for enhancing the efficiency of spin-injection magnetization reversal can be simplified. Therefore, manufacturing of a spin-injection magnetoresistance effect element is facilitated, which improves the manufacturing yield thereof.

The control factors, excluding the temperature dependence, of the critical current $I'_{c0}$ of spin-injection magnetization reversal are represented by the equation $I'_{c0} = e(M_s \cdot V/\mu_B)(\alpha \cdot \gamma \cdot H_{\text{eff}})/g$. e denotes the elementary charge. $\mu_B$ denotes the Bohr magneton. α denotes a damping coefficient (Gilbert damping coefficient). γ denotes the magnetic gyro constant. $H_{\text{eff}}$ denotes an effective magnetic field (external magnetic field+anisotropic magnetic field in the easy magnetization axis+demagnetization field in the film thickness direction), and is a function representing the efficiency of spin-injection magnetization reversal. g is a function of a spin transfer efficiency.

In the first embodiment, the magnetization reversal layer 20, the first and second magnetization reference layers 32 and 42 are composed of a magnetic material such as Co, Co—Fe, Ni—Fe, or Co—Fe—B. The first nonmagnetic film 31 and the nonmagnetic insulating film 50 are composed of an insulating material such as $AlO_x$, MgO, $SiO_2$, $TiO_2$, or $Cr_2O_3$. The second nonmagnetic film 41 is composed of a conductive material such as Cu or Ru. The first, second and third electrodes 34, 44 and 51 are composed of Cu, Au or the like. Alternatively, these electrodes are composed of a multi-layer film including an underlayer made of Cr, Ti or the like and an upper layer formed thereon made of Cu, Au or the like. The first and second antiferromagnetic layers 33 and 43 are composed of Mn—Ir, Pt—Mn or the like. An underlayer film composed of Ta, Cr, Ti or the like may be formed between the first electrode 34 and the first antiferromagnetic layer 33, and between the second electrode 44 and the second antiferromagnetic layer 43.

The third electrode 51 may be provided for each spin-injection magnetoresistance effect element as shown in FIG. 3, or alternatively may be provide for a spin-injection magnetoresistance effect element array, which is an assembly of a plurality of spin-injection magnetoresistance effect elements. That is, the third electrode 51 may be provided in common to a plurality of spin-injection magnetoresistance effect elements. Note that the equivalent circuit diagram of FIG. 2 illustrates the third electrode 51 provided in common to plural elements. When the third electrode 51 is provided for each spin-injection magnetoresistance effect element, each third electrode 51 is coupled via a switching element (formed of an FET, for example) 63 (see FIG. 3) to the second power supply 62. On that basis, when information is written to the magnetization reversal layer 20, the switching element is turned on, to thereby apply an adequate voltage from the second power supply 62 to the third electrode 51.

In the first embodiment, since the first nonmagnetic film 31 is composed of an insulating material, the first magnetization reference layer 32, the first nonmagnetic film (insulating barrier film) 31, and the magnetization reversal layer 20 form a multi-layer structure having a TMR effect. This multi-layer structure formed of the first magnetization reference layer 32, the first nonmagnetic film 31, and the magnetization reversal layer 20 will be referred to as a first multi-layer structure for convenience. Information stored in the magnetization reversal layer 20 can be retrieved as a difference of the resistance of the magnetization reversal layer 20. There are two kinds of the information as logical values: the information "0" corresponding to the state in which the magnetization direction of the magnetization reversal layer 20 is parallel to that of the first magnetization reference layer 32; and the information "1" corresponding to the state in which the directions are antiparallel. In other words, the magnetization reversal layer 20 shows a low resistance when the magnetization direction of the magnetization reversal layer 20 is parallel to that of the first magnetization reference layer 32, while the magnetization reversal layer 20 shows a high resistance when the magnetization direction of the magnetization reversal layer 20 is antiparallel to that of the first magnetization reference layer 32. Since the second nonmagnetic film 41 is composed of a conductive material, the second magnetization reference layer 42, the second nonmagnetic film 41, and the magnetization reversal layer 20 form a multi-layer structure having a GMR effect, depending on the case. This multi-layer structure formed of the second magnetization reference layer 42, the second nonmagnetic film 41, and the magnetization reversal layer 20 will be referred to as a second multi-layer structure for convenience. The magnetization direction of the first magnetization reference layer 32 is opposite to that of the second magnetization reference layer 42. Therefore, the second multi-layer structure having a GMR effect functions to counteract a resistance change of the first multi-layer structure having a TMR effect. Specifically, when the magnetization direction of the first magnetization reference layer 32 (the second magnetization reference layer 42) is parallel (antiparallel) to that of the magnetization reversal layer 20, the magnetization direction of the second magnetization reference layer 42 (the first magnetization reference layer 32) is antiparallel (parallel) to that of the magnetization reversal layer 20. However, a resistance change ratio based on a TMR effect (TMR ratio) is on the order of several tens of percents to several hundred percents, and this ratio is larger by a factor of several tens to several hundreds than a resistance change ratio based on a GMR effect (GMR ratio), which is on the order of several percents. This large difference permits neglect of the effect of the second multi-layer structure with a GMR effect on a resistance change in the first multi-layer structure with a TMR effect. The second multi-layer structure does not necessarily need to serve as a multi-layer structure having a GMR effect. Depending on the material (e.g. tungsten) of the second nonmagnetic film 41, the second multi-layer structure serves as a multi-layer structure without a GMR effect in some cases. Such a configuration also yields no problem. However, if both the first and second multi-layer structures are a multi-layer structure having a TMR effect, the second multi-layer structure completely cancels a resistance change in the first multi-layer structure, which precludes the detection of the resistance change.

The length $L_1$ and the width W of the magnetization reversal layer 20 are, for example, 150 to 200 nm and 50 nm, respectively. The thickness thereof is about several nanometers. The planar shape of the magnetization reversal layer 20 is designed to have an adequate aspect ratio (the ratio of the major axis length $L_1$ to the minor axis length W, about 3 is adequate, for example), which provides the magnetization reversal layer 20 with a shape magnetic anisotropy (uniaxial magnetic anisotropy). In addition, the magnetization reversal layer 20 is miniaturized to have a size on the order of 100 nm, to thereby promote the single-domain magnetization thereof. These shape features allow achievement of two stable magnetization states corresponding to binary information of "0" and "1." The magnetic stability is expressed by the magnetic anisotropy energy $K_u$ per unit volume of the magnetization reversal layer 20. The magnetic anisotropy energy of the spin-injection magnetoresistance effect element 10 is the product between the magnetic anisotropy energy $K_u$ and the volume V of the magnetization reversal layer 20. When the magnetization reversal layer 20 consists of a single magnetic domain and has a uniaxial anisotropy, the magnetic anisotropy energy $K_u$ can be expressed by the equation $K_u = M_s \cdot H_c / 2$. $M_s$ denotes the saturation magnetization of magnetic material of the magnetization reversal layer 20. $H_c$ denotes the coercivity of magnetic material of the magnetization reversal layer 20.

Since the writing current (the critical current of spin-injection magnetization reversal) is proportional to the volume V of the magnetization reversal layer 20, the length $L_1$ of the magnetization reversal layer 20 is decreased to the order of 100 nm in order to obtain a practical writing current value. However, too small a volume V of the magnetization reversal layer 20 causes a possibility that the magnetic anisotropy energy of the magnetization reversal layer 20 decreases, and therefore the requisite thermal fluctuation resistance for keeping the reliability as a memory element is not ensured. The first embodiment needs to ensure the above-described conditions and the state where the first and second magnetization reference layers 32 and 42 are positioned at the both ends of the magnetization reversal layer 20. Therefore, the length $L_1$ of the magnetization reversal layer 20 is set to 150 to 200 nm in the first embodiment.

The thermal fluctuation resistance is defined as $K_u \cdot V / k_B \cdot T$ as described above, and needs to be larger than about 40 ($K_u \cdot V / k_B \cdot T > 40$) for practical use.

The length $L_2$ of the magnetization reference layers 32 and 42 is 50 to 70 nm in the first embodiment. Both the layers 32 and 42 are processed so as not to protrude from the both ends of the magnetization reversal layer 20. There is no problem even if, at the time of processing the magnetization reference layers 32 and 42, the first antiferromagnetic layer 33 and the second antiferromagnetic layer 43 (sometimes generically referred to as the antiferromagnetic layers 33 and 43, hereinafter) under the layers 32 and 42 are also processed collectively (refer to the regions indicated by arrows X in FIG. 4, which is a conceptual diagram illustrating a spin-injection magnetoresistance effect element as a modification of the first embodiment). The respective magnetization directions of the magnetization reference layers 32 and 42 are fixed to one direction due to exchange coupling across the interface between the first magnetization reference layer 32 and the first antiferromagnetic layer 33, and due to exchange coupling across the interface between the second magnetization reference layer 42 and the second antiferromagnetic layer 43. In addition, the magnetization reference layers 32 and 42 are designed to have a small size, and thus the single-domain magnetizations of the layers 32 and 42 are promoted. Due to these features, the magnetizations of the magnetization reference layers 32 and 42 are aligned in one direction, which allows the layers 32 and 42 to serve as a high-quality spin filter, in other words, a spin injection source. The magnetization reference layers 32 and 42 may have any shape and any size essentially as long as the magnetizations in the magnetization reference layers 32 and 42 overlapping with the magnetization reversal layer 20 are aligned in one direction. If the magnetization reference layers 32 and 42 are exchange-coupled to the antiferromagnetic layers 33 and 43, respectively, with a sufficiently large coupling strength, shape anisotropies of the magnetization reference layers 32 and 42 are not necessarily required. The antiferromagnetic layers 33 and 43 are in contact with the entire surfaces of the magnetization reference layers 32 and 42, and have sizes equal to or larger than the sizes of the magnetization reference layers 32 and 42.

Figure 4:
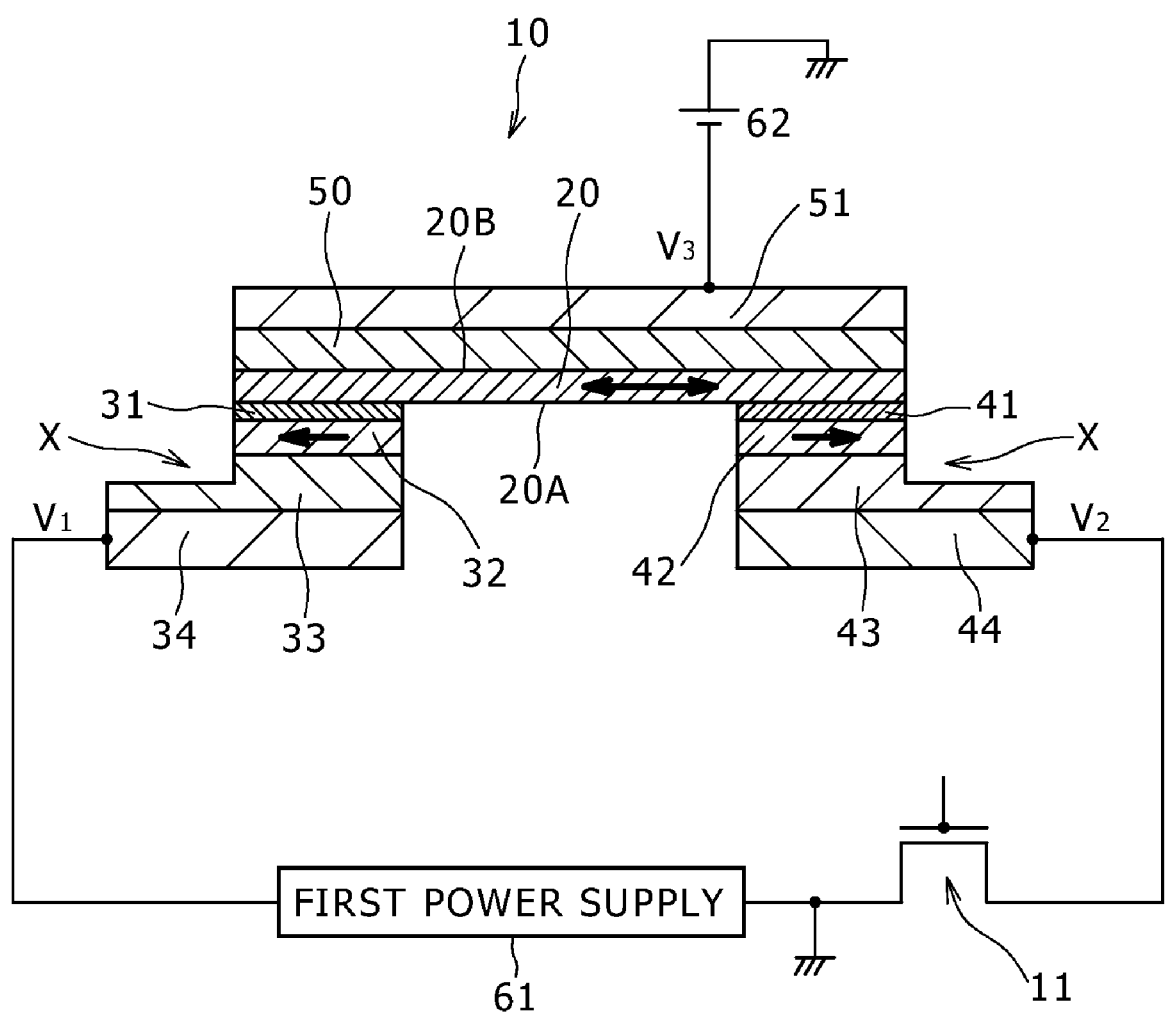
FIG. 4 is a conceptual diagram illustrating a modification of the spin-injection magnetoresistance effect element of the first embodiment.
Figure 5A:
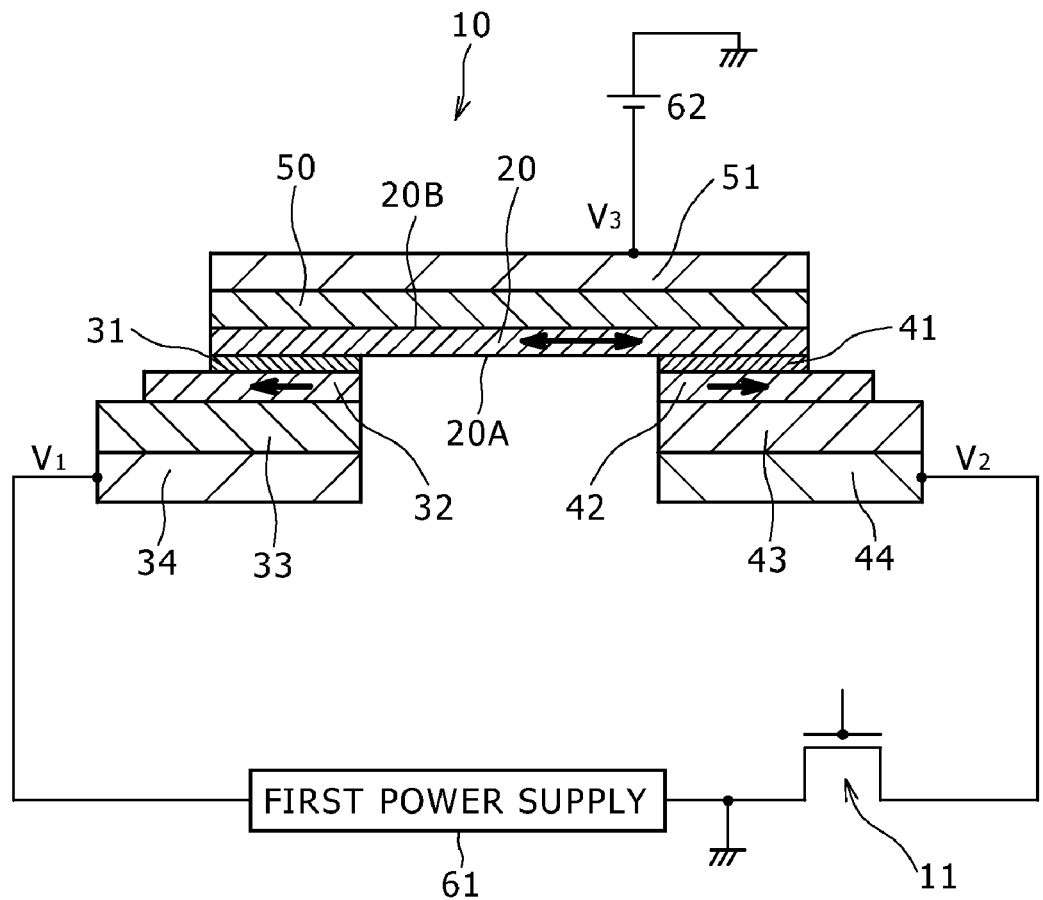
FIG. 5A is a conceptual diagram illustrating another modification of the spin-injection magnetoresistance effect element of the first embodiment.
Figure 5B:
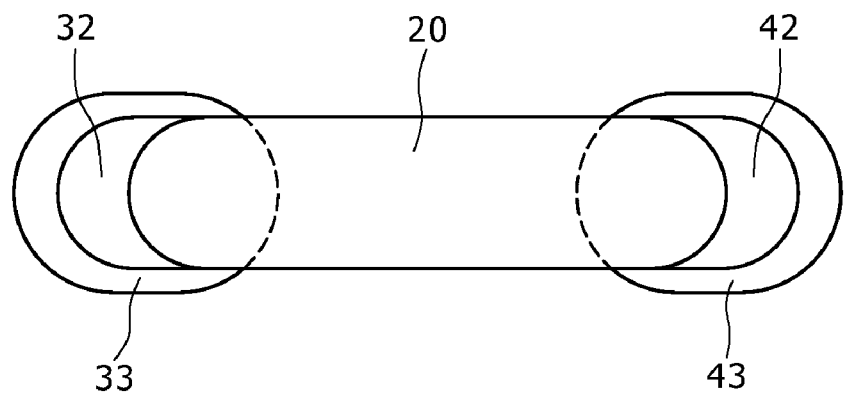
FIG. 5B is a schematic diagram showing the arrangement of the magnetization reversal layer, first magnetization reference layer and second magnetization reference layer shown in FIG. 5A.

FIG. 5A is a conceptual diagram illustrating another modification of the first embodiment. FIG. 5B is a schematic diagram illustrating the arrangement of the magnetization reversal layer 20, the first magnetization reference layer 32, the second magnetization reference layer 42, and other layers in this modification. As shown in these drawings, end faces of the magnetization reference layers 32 and 42 do not need to be flush with end faces of the magnetization reversal layer 20. The magnetization reference layers 32 and 42 may have any size and any shape essentially. However, it is required that the magnetizations in the magnetization reference layers 32 and 42 overlapping with the magnetization reversal layer 20 be aligned in one direction. Therefore, in order to allow the magnetization reference layers 32 and 42 to have any shape and any size, it is desirable for the magnetization reference layers 32 and 42 to be exchange-coupled to the antiferromagnetic layers 33 and 43, respectively. End faces of the magnetization reference layers 32 and 42 do not need to be flush with end faces of the antiferromagnetic layers 33 and 43. It should be noted that the example shown in FIGS. 5A and 5B can apply the features of the regions indicated by arrows X in FIG. 4.

When the magnetization reference layers 32 and 42 are formed of a single-layer film, it is desirable that the thicknesses thereof are about 10 nm. The area of the overlap region between the magnetization reference layers 32 and 42 and the magnetization reversal layer 20 is small, specifically 50 to 70 nm by 50 nm. Therefore, if the thicknesses of the magnetization reference layers 32 and 42 are several tens of nanometers or larger, the in-plane magnetic anisotropies thereof are lowered, and demagnetization fields at ends of the magnetization reference layers 32 and 42 increase. Accordingly, magnetization alignment at ends of the magnetization reference layers 32 and 42 is readily disturbed. Furthermore, the magnetic field strength of exchange coupling between the magnetization reference layers 32 and 42 and the antiferromagnetic layers 33 and 43 decreases in inverse proportion to the thicknesses of the magnetization reference layers 32 and 42. Therefore, larger thicknesses of the magnetization reference layers 32 and 42 lead to more difficulty in aligning the magnetization inside the magnetization reference layers 32 and 42 (particularly at ends thereof) in one direction. In addition, disarrangement of the magnetization in the magnetization reference layers 32 and 42 due to a disturbance magnetic field is readily caused. In contrast, if the thicknesses of the magnetization reference layers 32 and 42 are too small, the function thereof as a spin filter is deteriorated. Therefore, when the magnetization reference layers 32 and 42 are formed of a single-layer film, it is desirable for the layers 32 and 42 to have a thickness equivalent to at least the spin diffusion length. The spin diffusion length differs depending on the magnetic materials of the magnetization reference layers 32 and 42, and changes also depending on the materials of adjacent and close films. Therefore, the thicknesses of the magnetization reference layers 32 and 42 need to be adequately determined with consideration of the magnetic materials and layer structure, so that the above-described various conditions are satisfied.

The distance $L_3$ between the first and second magnetization reference layers 32 and 42 is about 50 to 60 nm in the first embodiment. The distance $L_3$ between the first and second magnetization reference layers 32 and 42 may take any value essentially as long as the first and second magnetization reference layers 32 and 42 are physically separated from each other. However, too small a distance $L_3$ possibly causes repulsion of magnetic poles at facing ends of the first and second magnetization reference layers 32 and 42, which disturbs the magnetization directions of the first and second magnetization reference layers 32 and 42. That is, it probably becomes difficult to ensure the magnetization directions that are uniaxially antiparallel. Pinning of magnetizations of the magnetization reference layers 32 and 42 by exchange coupling with the antiferromagnetic layers 33 and 43 can suppress the disturbance of the magnetizations due to magnetic pole repulsion to a large extent. As will be described in a second embodiment of the invention, if either one of the first and second magnetization reference layers 32 and 42 is formed of a synthetic ferri-magnetic structure based on antiferromagnetic coupling, the magnetization disturbance can be suppressed more effectively since the net magnetization of the synthetic ferri-magnetic structure is extremely small.

The resistance of the first multi-layer structure is 20 kΩ for example. Therefore, if a voltage of 1 V is applied between the first electrode 34 and the second electrode 44 for writing/reading information, the current flowing through the first multi-layer structure is 50 μA. Since the writing current $I_c$ can be reduced to several tens of microamperes in the first embodiment, the area resistance R·A of the first multi-layer structure (more specifically, the first nonmagnetic film 31) can be enhanced to several tens of ohm-square micrometers (e.g. 50 Ω·μm$^2$). The area resistance R·A is the product between the resistance and area of the first nonmagnetic film 31. This area resistance R·A is about ten times the area resistance R·A of a conventional TMR effect multi-layer structure that allows spin-injection magnetization reversal. Accordingly, there is no need to excessively decrease the thickness of the first nonmagnetic film 31, which is an insulating barrier film. Therefore, the electrical reliability and breakdown voltage of the first nonmagnetic film 31 can be enhanced, and the reliability of the first multi-layer structure having a TMR effect can be improved. Furthermore, the formation of the first multi-layer structure having a TMR effect is facilitated, which improves the manufacturing yield of the spin-injection magnetoresistance effect element 10. The insulation breakdown voltage of the first nonmagnetic film 31 that has an area resistance R·A of about 50 Ω·μm$^2$ and is composed of an insulating film is about one and several tenths of volts when the film 31 is composed of $AlO_x$ for example, although depending on the insulating material and film quality of the film 31. Therefore, the above-described application voltage of 1 V for writing/reading is a voltage that can sufficiently keep the reliability of the device as a writing/reading voltage for a high-capacity memory device.

The reliability of the first multi-layer structure having a TMR effect is determined dominantly by the extremely thin first nonmagnetic film 31. Typically, the first nonmagnetic film 31 needs to be thin in order to obtain a low-resistance first multi-layer structure. The thickness reduction of the first nonmagnetic film 31 however leads to decrease of the insulation breakdown voltage of the film 31, and significant deterioration of the first nonmagnetic film 31 due to repetition of current injection. In contrast, embodiments of the present invention allow use of a small writing current. Consequently, the first nonmagnetic film 31 is permitted to have a higher resistance, which allows use of the film 31 having a larger thickness. As a result, the insulation breakdown voltage of the first nonmagnetic film 31 increases, which also contributes to enhancement of the reliability of the first multi-layer structure with a TMR effect.

In addition, since a high resistance of the first nonmagnetic film 31 is allowed and the reading current $I_r$ can be increased, the magnitude of outputs and S/N ratio can be enhanced. In a conventional first multi-layer structure with a TMR effect, the area resistance R·A needs to be about 10 $\Omega \cdot \mu m^2$ or smaller, in order to ensure spin-injection magnetization reversal with preventing the insulation breakdown of the first nonmagnetic film 31. In contrast, the first embodiment allows use of writing current on the order of several tens of microamperes or smaller, which can set the area resistance R·A to several tens of ohm-square micrometers. This large area resistance R·A in combination with a large reading current $I_r$ can increase output voltages and the S/N ratio.

The following method is available as one measure for ensuring the magnetization direction of the first magnetization reference layer 32 opposite (antiparallel) to that of the second magnetization reference layer 42. Specifically, for example, a method is available that uses a combination between a first layer pair of the first magnetization reference layer 32 and the first antiferromagnetic layer 33 and a second layer pair of the second magnetization reference layer 42 and the second antiferromagnetic layer 43, and the first and second layer pairs have different blocking temperatures. The blocking temperature is the temperature at which exchange coupling between a magnetization reference layer and an antiferromagnetic layer adjacent thereto is eliminated. More specifically, the first antiferromagnetic layer 33 is composed of Mn—Ir, while the second antiferromagnetic layer 43 is composed of Pt—Mn for example. In addition, by controlling the temperature and magnetic field direction in magnetic annealing for developing exchange coupling, directions of exchange coupling (unidirectional anisotropy) after cooling can be made opposite (antiparallel). Alternatively, a method is also available in which a synthetic ferri-magnetic structure is used as the structure of either one of the first magnetization reference layer 32 and the second magnetization reference layer 42, like the second embodiment to be described later. The magnetization reference layer with the synthetic ferri-magnetic structure includes a first layer remote from the magnetization reversal layer 20, and a second layer adjacent to the magnetization reversal layer 20. The magnetization direction of the first layer is the same as the magnetization direction of the magnetization reference layer that does not have a synthetic ferri-magnetic structure, while the magnetization direction of the second layer is opposite to that. In this case, the antiferromagnetic layers 33 and 43 can be formed of the same antiferromagnetic material.

Second Embodiment

Figure 6A:
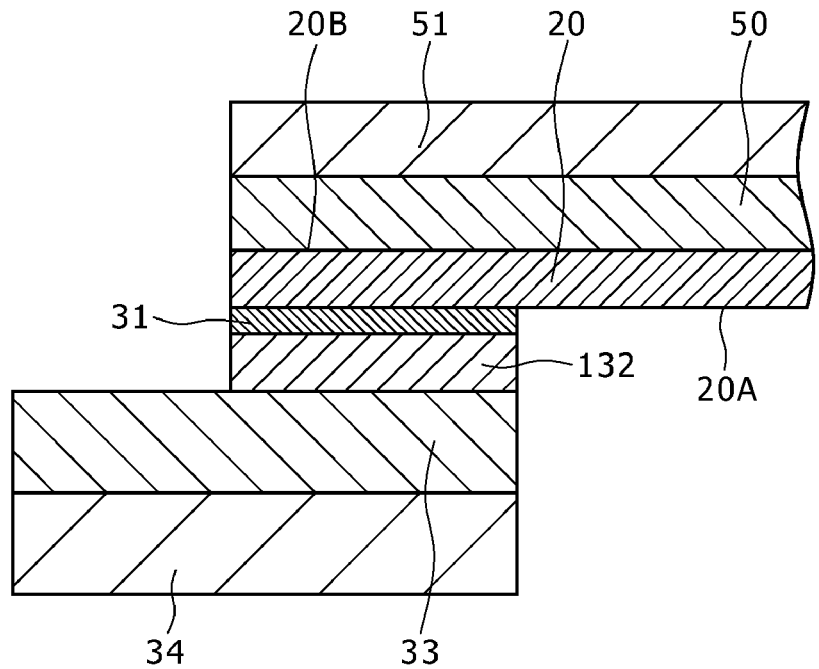
FIG. 6A is a conceptual diagram illustrating part of a spin-injection magnetoresistance effect element according to a second embodiment of the invention.
Figure 6B:
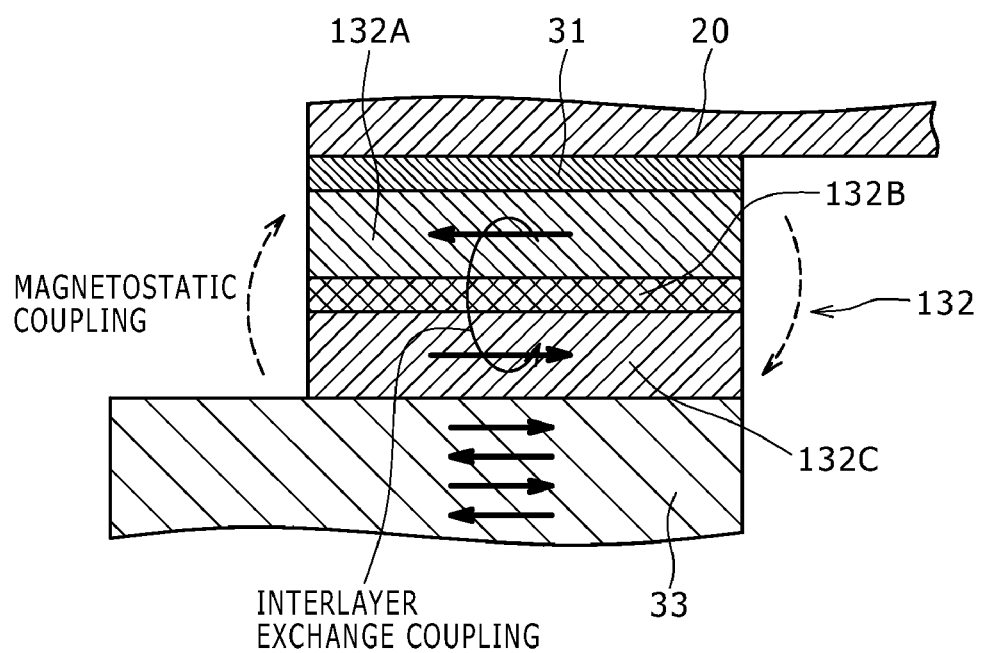
FIG. 6B is an enlarged conceptual diagram illustrating a first magnetization reference layer and other layers in the spin-injection magnetoresistance effect element of the second embodiment.

The second embodiment is obtained by modifying part of the first embodiment. A spin-injection magnetoresistance effect element of the second embodiment is different from an element of the first embodiment in that in the second embodiment, a synthetic ferri-magnetic structure is employed for either one of the first and second magnetization reference layers. In the following description, a first magnetization reference layer 132 has a synthetic ferri-magnetic structure. FIG. 6A is a conceptual diagram illustrating part of a spin-injection magnetoresistance effect element of the second embodiment. FIG. 6B is an enlarged conceptual diagram illustrating the first magnetization reference layer 132 and other layers in the spin-injection magnetoresistance effect element of the second embodiment. It should be noted that a structure in which the second magnetization reference layer 42 has a synthetic ferri-magnetic structure is also available.

In the second embodiment, the first magnetization reference layer 132 is formed of a multi-layer structure including a first ferromagnetic material layer (spin filter) 132A, a nonmagnetic spacer layer 132B, and a second ferromagnetic material layer 132C. One surface of the first ferromagnetic material layer 132A is in contact with the first nonmagnetic film 31, and the other surface thereof is in contact with the nonmagnetic spacer layer 132B. One surface of the second ferromagnetic material layer 132C is in contact with the nonmagnetic spacer layer 132B, and the other surface thereof is in contact with the first antiferromagnetic layer 33. When the nonmagnetic spacer layer 132B composed of Ru is designed to have a thickness of about 0.8 nm, the first ferromagnetic material layer 132A and the second ferromagnetic material layer 132C are coupled to each other via the nonmagnetic spacer layer 132B by antiferromagnetic interlayer exchange coupling. This phenomenon is referred to as RKKY (Ruderman-Kittel-Kasuya-Yoshida) interaction. It is considered that Ru is the material offering the largest magnitude of the RKKY interaction.

The magnetization directions of the following layers are the same (parallel): the second ferromagnetic material layer 132C, part of the first antiferromagnetic layer 33 near the interface to the second ferromagnetic material layer 132C, the second magnetization reference layer 42, and part of the second antiferromagnetic layer 43 near the interface to the second magnetization reference layer 42. That is, unidirectional anisotropies due to exchange coupling across the interface between the ferromagnetic material layer and antiferromagnetic layer, and the interface between the magnetization reference layer and antiferromagnetic layer, are in the same direction. In contrast, the magnetization direction of the first ferromagnetic material layer 132A is opposite (antiparallel) to that of the second ferromagnetic material layer 132C.

If either one of the first and second magnetization reference layers is provided with a synthetic ferri-magnetic structure, the magnetization directions of the second ferromagnetic material layer 132C and the first ferromagnetic material layer 132A inevitably become opposite (antiparallel) after magnetic annealing. Accordingly, the magnetization direction of the first ferromagnetic material layer 132A, which serves as a spin filter, becomes opposite (antiparallel) to that of the second magnetization reference layer 42. In this configuration, the first and second antiferromagnetic layers 33 and 43 can be formed of the same antiferromagnetic layer. Although either layer of the first and second magnetization reference layers may have a synthetic ferri-magnetic structure, it is preferable that the first multi-layer structure having a TMR effect is provided with a synthetic ferri-magnetic structure, according to experience.

Since the adoption of a synthetic ferri-magnetic structure antiferromagnetically couples magnetizations of two magnetic layers (the second ferromagnetic material layer 132C and the first ferromagnetic material layer 132A), the net magnetization at ends of the second ferromagnetic material layer 132C and the first ferromagnetic material layer 132A is extremely small. Thus, disturbance of the magnetization (offset from the easy magnetization axis) at ends of the first ferromagnetic material layer 132A virtually disappears, which allows the entire first ferromagnetic material layer 132A to serve as a favorable spin filter. In addition, even if the distance $L_3$ between the first and second magnetization reference layers 132 and 42 is small (the layers 132 and 42 are close to each other), magnetic repulsion and magnetization disturbance due to the repulsion hardly occur since the magnetization of one of the layers is almost absent. Moreover, the first magnetization reference layer 132 as a whole virtually has an antiferromagnetic structure, and therefore is unsusceptible to the magnetic field from the second magnetization reference layer 42 and external magnetic fields. The magnetic field strength of interlayer exchange coupling is higher than the magnetic field strength of exchange coupling between the single-layer first magnetization reference layer 32 and the first antiferromagnetic layer 33 in the first embodiment. This high field strength enhances the tendency of the first ferromagnetic material layer 132A to consist of a single magnetic domain.

Furthermore, the use of a synthetic ferri-magnetic structure allows the first ferromagnetic material layer 132A and the second ferromagnetic material layer 132C to have a small thickness of 2 to 3 nm. Even if the thickness is smaller than the spin diffusion length in a magnetic layer, the first ferromagnetic material layer 132A can serve as a spin filter. It is also unnecessary that the second ferromagnetic material layer 132C in contact with the first antiferromagnetic layer 33 has a thickness larger than the spin diffusion length unlike a single-layer magnetization reference layer (refer to the first embodiment). Therefore, the strength of the exchange coupling magnetic field applied to the second ferromagnetic material layer 132C due to exchange coupling between the second ferromagnetic material layer 132C and the first antiferromagnetic layer 33 can be maintained high. This is because the magnetic field strength of the exchange coupling between the second ferromagnetic material layer 132C and the first antiferromagnetic layer 33 is in inverse proportion to the thickness of the second ferromagnetic material layer 132C. However, too large thicknesses of the first and second ferromagnetic material layers 132A and 132C in a synthetic ferri-magnetic structure lead to a small polarization ratio of a spin-polarized current in some cases. It therefore is desirable for the first and second ferromagnetic material layers 132A and 132C to have a thickness of about 2 to 3 nm.

When the thicknesses of the first and second ferromagnetic material layers 132A and 132C are the same, these layers form a synthetic antiferro-magnetic structure, which is equivalent to a synthetic ferri-magnetic structure essentially.

A structure is also available in which either one of the first and second magnetization reference layers has a magnetostatically coupled structure. In the following description, the first magnetization reference layer has a magnetostatically coupled structure. The adoption of a magnetostatically coupled structure also allows the magnetization directions of the first and second ferromagnetic material layers 132A and 132C of the first magnetization reference layer 132 to be opposite (antiparallel) to each other. However, the use of a magnetostatically coupled structure requires that end faces of the first and second ferromagnetic material layers 132A and 132C be flush with each other. In the above-described RKKY interlayer exchange coupling, layers are coupled via the interfaces therebetween, and therefore the first and second ferromagnetic material layers 132A and 132C are coupled even if end faces thereof are not flush with each other. In a magnetostatically coupled structure, the nonmagnetic spacer layer 132B does not need to be composed of Ru, but can be formed of any nonmagnetic material. Typically, an antiparallel arrangement based on a magnetostatically coupled structure is not referred to as a synthetic ferri-magnetic structure. When end faces of two magnetic layers are close to each other, a synthetic ferri-magnetic structure also encompasses antiparallel coupling based on magnetostatic coupling.

Figure 7:
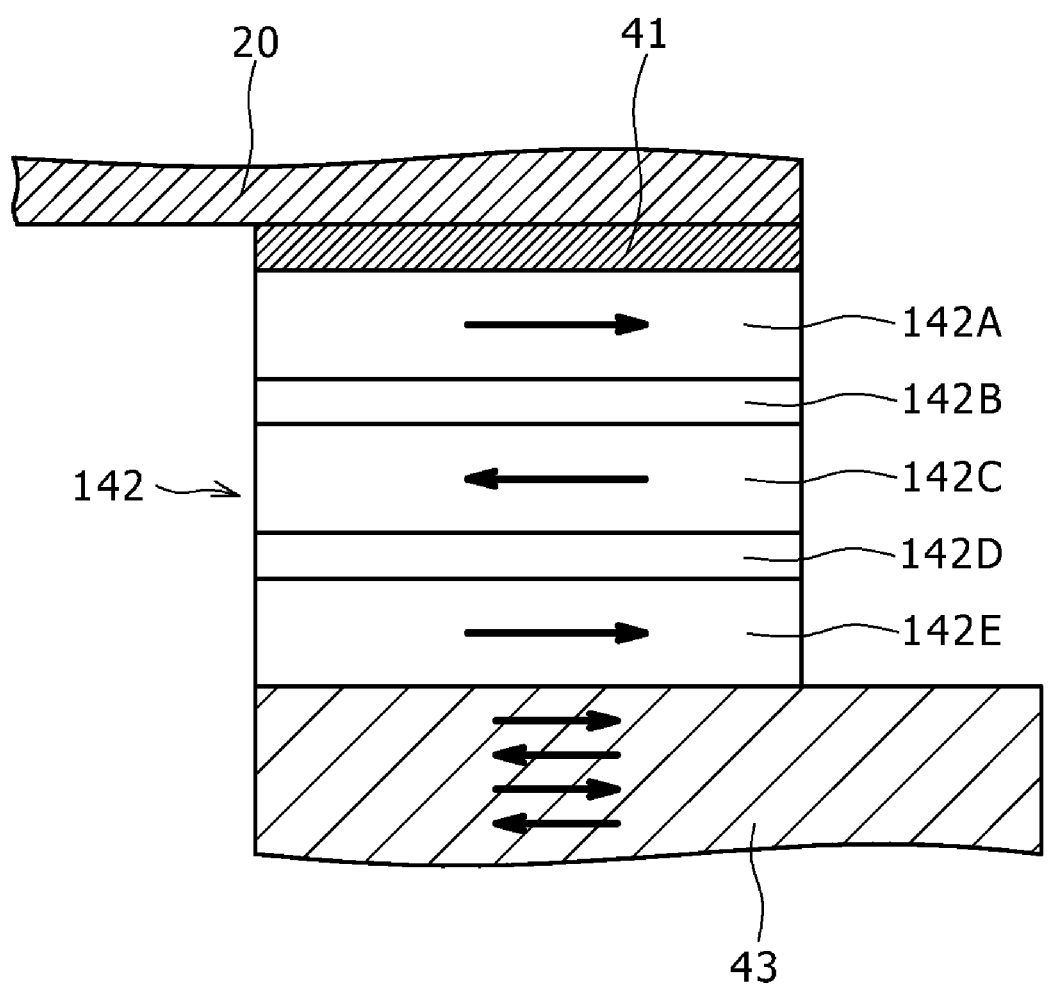
FIG. 7 is an enlarged conceptual diagram illustrating a second magnetization reference layer and other layers in a modification of the spin-injection magnetoresistance effect element of the second embodiment.

FIG. 7 is a conceptual diagram illustrating, in a magnified form, a second magnetization reference layer 142 and other layers in a spin-injection magnetoresistance effect element 10 according to a modification of the second embodiment. In this modification, the second magnetization reference layer 142 also has a synthetic ferri-magnetic structure. The first magnetization reference layer 132 has a three-layer structure of the first ferromagnetic material layer 132A, the nonmagnetic spacer layer 132B, and the second ferromagnetic material layer 132C. In contrast, the second magnetization reference layer 142 has a five-layer structure of a first ferromagnetic material layer 142A, a first nonmagnetic spacer layer 142B, a second ferromagnetic material layer 142C, a second nonmagnetic spacer layer 142D, and a third ferromagnetic material layer 142E. The adoption of this structure easily allows, through only one time of magnetic annealing, the magnetization direction of the first ferromagnetic material layer 132A in the first magnetization reference layer 132 to be antiparallel to that of the first ferromagnetic material layer 142A in the second magnetization reference layer 142. That is, the magnetization directions of the first ferromagnetic material layers 142A and 132A can be rendered antiparallel to each other, while the magnetization direction of the second ferromagnetic material layer 132C in the first magnetization reference layer 132 is kept parallel to that of the third ferromagnetic material layer 142E in the second magnetization reference layer 142. The numbers of layers in the first and second magnetization reference layers 132 and 142 are not limited to three and five, respectively, as long as the following conditions are satisfied: in the first and second magnetization reference layers, the ferromagnetic material layers adjacent to the magnetization reversal layer 20 with the intermediary of the first and second nonmagnetic films, respectively, have magnetization directions antiparallel to each other, and the ferromagnetic material layers in contact with the respective antiferromagnetic layers have magnetization directions parallel to each other.

The modifications of the first embodiment shown in FIGS. 4, 5A and 5B can also be applied to the structures of the first and second magnetization reference layers in the second embodiment, third and fourth embodiments of the invention to be described later, and various modifications of these embodiments.

Third Embodiment

Figure 8A:
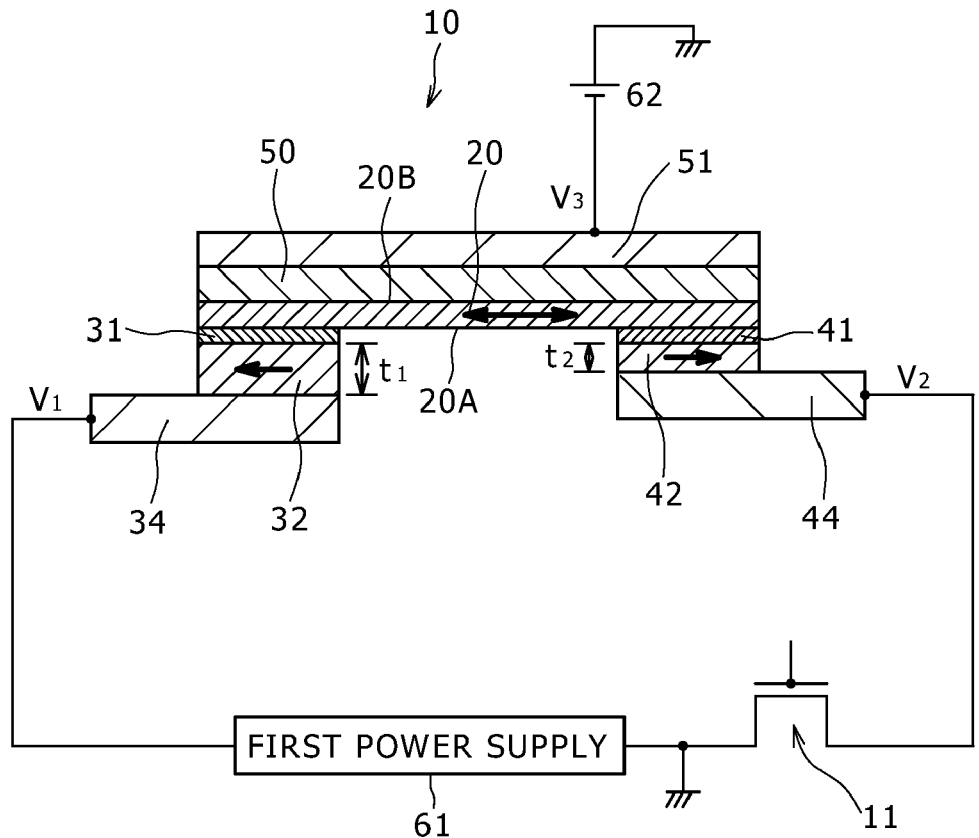
FIG. 8A is a conceptual diagram illustrating a spin-injection magnetoresistance effect element according to a third embodiment of the invention.

The third embodiment is also obtained by modifying part of the first embodiment. A spin-injection magnetoresistance effect element of the third embodiment is different from an element of the first embodiment in that in the third embodiment, first and second magnetization reference layers 32 and 42 have sufficiently high magnetic anisotropy energy ($K_u \cdot V$), and therefore the first and second antiferromagnetic layers 33 and 43 are absent. FIG. 8A is a conceptual diagram illustrating a spin-injection magnetoresistance effect element according to the third embodiment.

The expression that the magnetic anisotropy energy ($K_u \cdot V$) is "sufficiently high" means the following states:
(1) The magnetization directions of the first and second magnetization reference layers 32 and 42 overlapping with the magnetization reversal layer 20 can be parallel to the easy magnetization axis of the magnetization reversal layer 20. That is, the magnetization reference layers 32 and 42 maintain a single domain state, against demagnetization fields at ends of the magnetization reversal layer 20; and
(2) The thermal fluctuation resistances of the magnetization reference layers 32 and 42 satisfy the relationship $K_u \cdot V / k_B \cdot T > 40$.

Such magnetization reference layers 32 and 42 having sufficiently high magnetic anisotropy energy ($K_u \cdot V$) can be achieved by any of the following methods:
(a) enhancing the shape magnetic anisotropies and/or magnetocrystalline anisotropies of the magnetization reference layers 32 and 42;
(b) increasing the saturation magnetizations of magnetic materials of the magnetization reference layers 32 and 42; and
(c) setting the sizes of the magnetization reference layers 32 and 42 to the order of 100 nm.

Figure 8B:
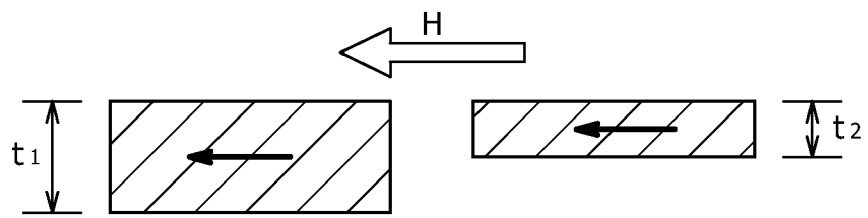
FIGS. 8B and 8C are schematic diagrams illustrating a first magnetization reference layer and a second magnetization reference layer in the spin-injection magnetoresistance effect element of the third embodiment, and explaining a method for obtaining antiparallel magnetization directions of the first and second magnetization reference layers.
Figure 8C:
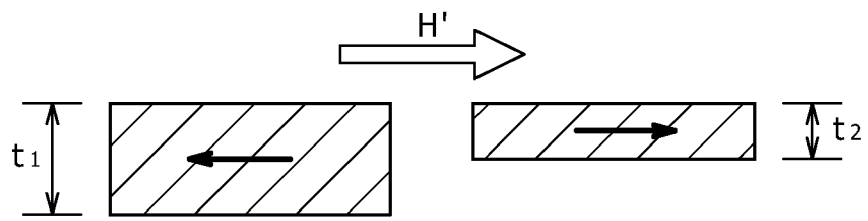

In order to obtain antiparallel magnetization directions of the first and second magnetization reference layers 32 and 42 in the absence of the antiferromagnetic layers 33 and 43, the following method is available, for example. Specifically, the magnetization reference layer 32 having a thickness $t_1$ and the second magnetization reference layer 42 having a thickness $t_2$ are formed. The thickness $t_2$ is not equalized to the thickness $t_1$. More specifically, the thickness $t_2$ is set smaller than the thickness $t_1$. The same magnetic material can be used for the first and second magnetization reference layers 32 and 42. The coercivities $H_{c1}$ and $H_{c2}$ of the magnetization reference layers 32 and 42 are expressed by the products between the saturation magnetizations $M_{1s}$ and $M_{2s}$ of magnetic materials of the magnetization reference layers 32 and 42 and the thicknesses $t_1$ and $t_2$ of the magnetization reference layers 32 and 42, respectively. When the coercivities have the relationship $H_{c1} > H_{c2}$, a magnetic field having a field strength H large than $H_{c1}$ ($= M_{1s} \cdot t_1$) is applied to the magnetization reference layers 32 and 42 in the left direction. Thus, the magnetization directions of the magnetization reference layers 32 and 42 become the left direction as seen in FIG. 8B. Subsequently, as shown in FIG. 8C, a magnetic field with a field strength H' satisfying the relationship $H_{c1} > H' > H_{c2}$ ($= M_{2s} \cdot t_2$) is applied to the magnetization reference layers 32 and 42. Due to this application, the magnetization direction of the magnetization reference layer 42 is turned to the right direction as seen in FIG. 8C, while the magnetization direction of the magnetization reference layer 32 is kept as the left direction as seen in FIG. 8C. In this manner, the magnetization directions of the first and second magnetization reference layers 32 and 42 can be rendered antiparallel.

Figure 9A:
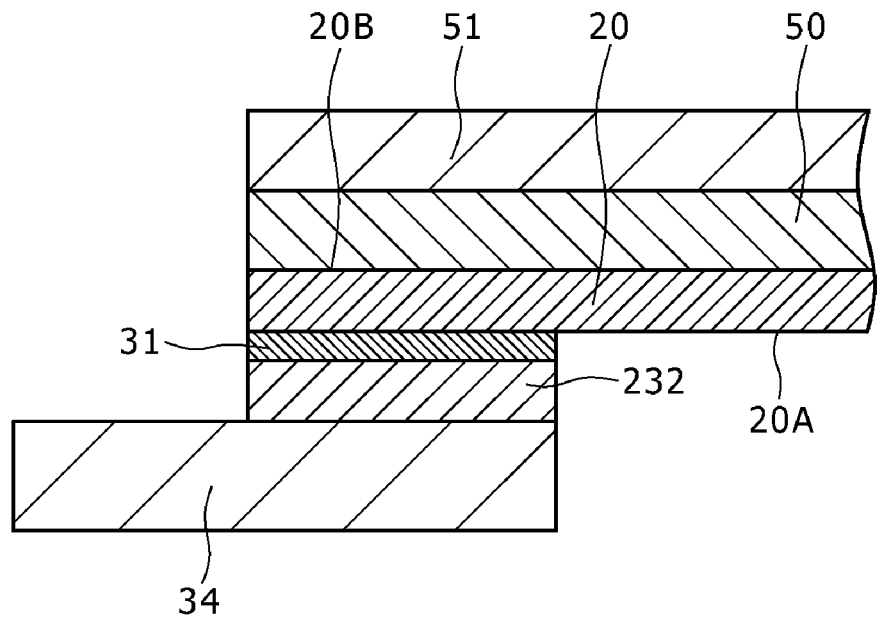
FIG. 9A is a conceptual diagram illustrating part of a modification of a spin-injection magnetoresistance effect element of the third embodiment.
Figure 9B:
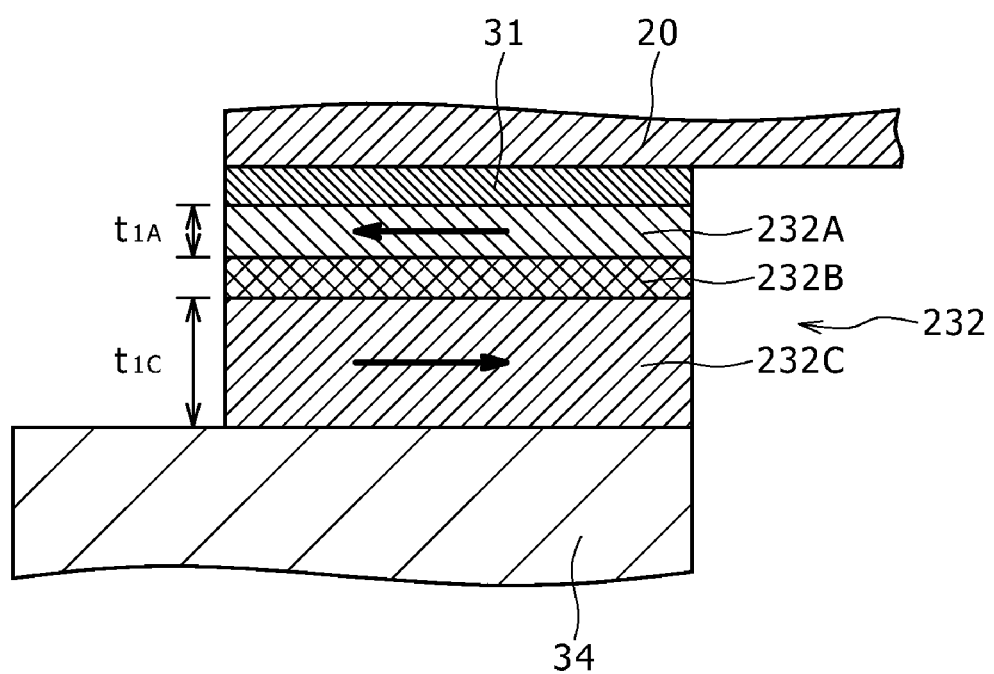
FIG. 9B is an enlarged conceptual diagram illustrating a first magnetization reference layer and other layers in the modification of the spin-injection magnetoresistance effect element of the third embodiment.

A modification of the third embodiment will now be described. FIG. 9A is a conceptual diagram illustrating part of a spin-injection magnetoresistance effect element of the modification. FIG. 9B is an enlarged conceptual diagram illustrating a first magnetization reference layer 232 and other layers in the spin-injection magnetoresistance effect element. In this modification, similarly to the second embodiment, either one of the first and second magnetization reference layers is provided with a synthetic ferri-magnetic structure (in the illustrated example, the first magnetization reference layer 232 has a synthetic ferri-magnetic structure). In this configuration, merely by applying to the first and second magnetization reference layers 232 and 42 a magnetic field that can saturate both the first and second magnetization reference layers 232 and 42, the magnetization direction of a first ferromagnetic material layer (spin filter) 232A of the first magnetization reference layer 232 can be made antiparallel to that of the second magnetization reference layer 42. Note that the magnetization direction of a second ferromagnetic material layer 232C is parallel to that of the second magnetization reference layer 42. This modification example needs to satisfy the relationship $M_{1Cs} \cdot t_{1C} > M_{1As} \cdot t_{1A}$, where $M_{1As}$ and $t_{1A}$ denote the saturation magnetization and thickness of the first ferromagnetic material layer (spin filter) 232A, respectively, and $M_{1Cs}$ and $t_{1C}$ denote the saturation magnetization and thickness of the second ferromagnetic material layer 232C, respectively.

The adoption of a synthetic ferri-magnetic structure can offer the same various advantages as those of the second embodiment. If the first ferromagnetic material layer (spin filter) 232A and the second ferromagnetic material layer 232C in the first magnetization reference layer 232 have flush end faces, an antiparallel arrangement based on magnetostatically coupling is allowed. In this case, the material of a nonmagnetic spacer layer 232B is not limited to Ru, but any nonmagnetic material can be used.

Fourth Embodiment

Figure 10A:
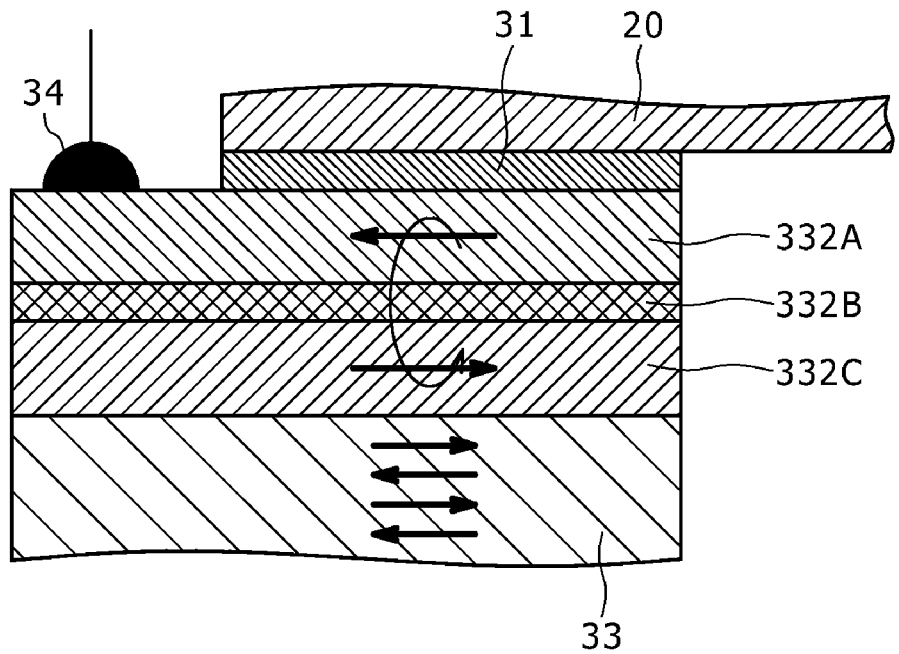
FIG. 10A is an enlarged conceptual diagram illustrating a first magnetization reference layer and other layers in a spin-injection magnetoresistance effect element according to a fourth embodiment of the invention.
Figure 10B:
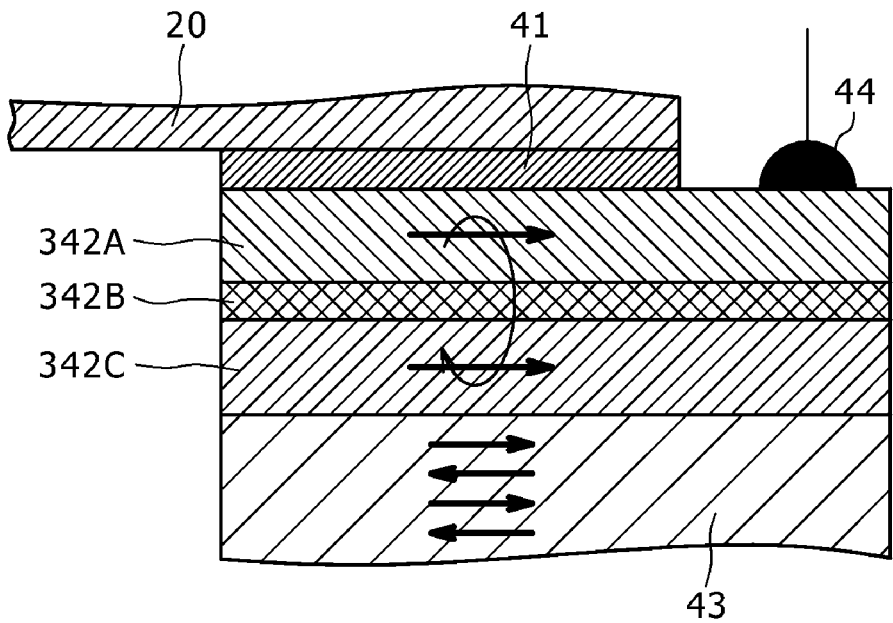
FIG. 10B is an enlarged conceptual diagram illustrating a second magnetization reference layer and other layers in the spin-injection magnetoresistance effect element of the fourth embodiment.

The fourth embodiment is also obtained by modifying part of the first embodiment. A spin-injection magnetoresistance effect element of the fourth embodiment is different from an element of the first embodiment in that in the fourth embodiment, a first magnetization reference layer 332 has a synthetic ferri-magnetic structure (antiferromagnetic coupling) while a second magnetization reference layer 342 has a synthetic ferro-magnetic structure (ferromagnetic coupling). FIG. 10A is an enlarged conceptual diagram illustrating the first magnetization reference layer 332 and other layers in a spin-injection magnetoresistance effect element of the fourth embodiment. FIG. 10B is an enlarged conceptual diagram illustrating the second magnetization reference layer 342 and other layers.

The strength (polarity and strength) of RKKY interlayer exchange coupling changes in an oscillatory manner depending on the thickness of the nonmagnetic spacer layers 332B and 342B composed of Ru. Adjusting the thickness of the nonmagnetic spacer layer 332B can control the coupling state between a first ferromagnetic material layer (spin filter) 332A and a second ferromagnetic material layer 332C in the first magnetization reference layer 332. Adjusting the thickness of the nonmagnetic spacer layer 342B can control the coupling state between a first ferromagnetic material layer (spin filter) 342A and a second ferromagnetic material layer 342C in the second magnetization reference layer 342. Specifically, in order to obtain antiferromagnetic coupling, the nonmagnetic spacer layer composed of Ru is designed to have a thickness of 0.7 to 0.8 nm. In order to obtain ferromagnetic coupling, the nonmagnetic spacer layer composed of Ru is designed to have a thickness of 0.4 to 0.5 nm, or a thickness of one and several tenths of nanometers. Experiments can determine the more definite thicknesses.

Also by providing the first and second magnetization reference layers 332 and 342 with a synthetic ferri-magnetic structure (antiferromagnetic coupling) and a synthetic ferromagnetic structure (ferromagnetic coupling), respectively, the magnetization direction of the first ferromagnetic material layer (spin filter) 332A in the first magnetization reference layer 332 can be made antiparallel to that of the first ferromagnetic material layer (spin filter) 342A in the second magnetization reference layer 342.

FIGS. 10A and 10B illustrate a structure in which the first and second electrodes 34 and 44 are directly connected to the first and second magnetization reference layers 332 and 342, respectively. Such a structure can also be applied to the first to third embodiments.

Figure 11A:
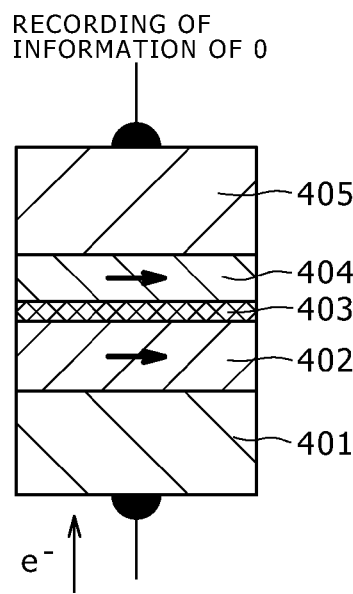
FIG. 11A is a conceptual diagram illustrating a conventional non-volatile magnetic memory element employing spin-injection magnetization reversal.
Figure 11A:
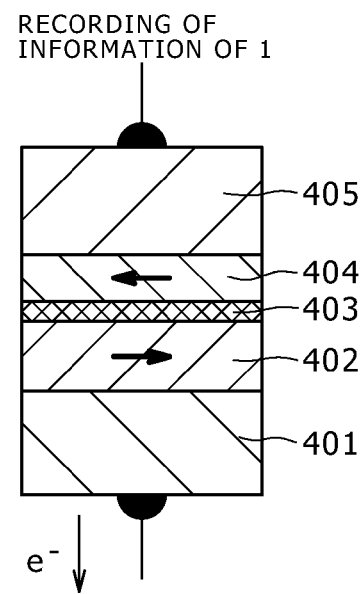
Figure 11B:
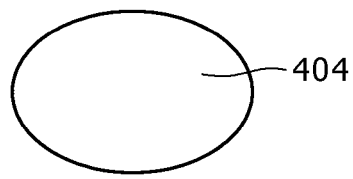
FIG. 11B is a schematic plan view of a magnetization reversal layer.
Figure 11C:
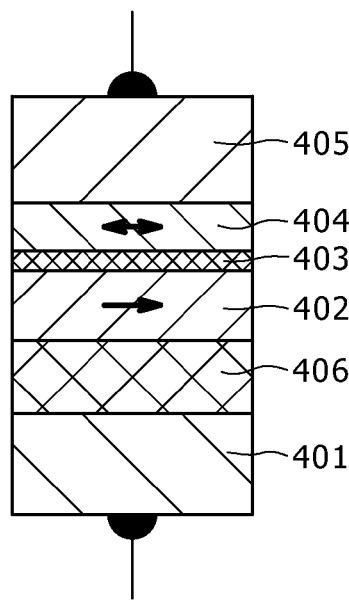
FIG. 11C is a schematic diagram illustrating a conventional non-volatile magnetic memory element that employs spin-injection magnetization reversal and includes a magnetization reference layer of which magnetization direction is fixed due to exchange coupling to an antiferromagnetic layer.
Figure 11D:
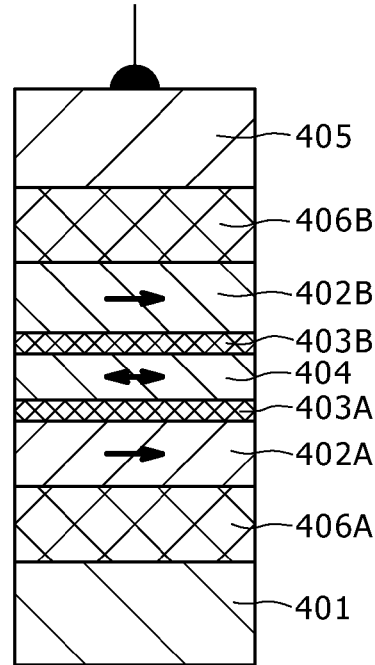
FIG. 11D is a conceptual diagram illustrating a non-volatile magnetic memory element having a double spin filter structure.

Preferred embodiments of the present invention have been described above. The invention however is not limited to these embodiments. Various multi-layer structures, materials and so forth described in the embodiments are merely examples, and can be changed and modified adequately. Each of the embodiments employs a spin-injection magnetoresistance effect element in which a third electrode is provided as the uppermost layer. Alternatively, another spin-injection magnetoresistance effect element is also available in which the deposition order of layers is reversed and thus a third electrode is provided as the lowermost layer. Moreover, still another spin-injection magnetoresistance effect element is also available in which a third electrode is absent. Such a structure can improve the efficiency of spin-injection magnetization reversal compared with a conventional spin-injection magnetoresistance effect element shown in FIG. 11A, for example. In the above-described embodiments, the first and second directions as the magnetization directions of the first and second magnetization reference layers, respectively, have separating vectors (i.e., the first and second directions are the left and right directions, respectively, as seen in the drawings). Alternatively, the first and second directions may have, vice verse, approaching vectors, which are relatively equivalent to the separating vectors in terms of magnetic alignment.

The above-described embodiments relate to a spin-injection magnetoresistance effect element applied to MRAM. In addition, a spin-injection magnetoresistance effect element according to embodiments of the invention can also be applied to current sensors and voltage sensors.

When a spin-injection magnetoresistance effect element of one embodiment of the invention is applied to a ternary-output current sensor for example, the first and second electrodes 34 and 44 are used as probes of the current sensor. Before current measurement, information "0" for example as a logical value is recorded in advance in the magnetization reversal layer 20 of the spin-injection magnetoresistance effect element. The amount of a current flowing between the first and second electrodes 34 and 44 (current to be detected by the current sensor) is defined as "i." Furthermore, the writing current (i.e., the critical current of spin-injection magnetization reversal) when no voltage is applied to the third electrode 51 is defined as $I'_c$. The writing current (i.e., the critical current of spin-injection magnetization reversal) when a voltage is applied to the third electrode 51 is defined as $I_c$ ($<I'_c$). When a current to be detected is passed between the first and second electrodes, the information stored in the magnetization reversal layer 20 changes from 0 to 1 or remains at 0, as shown in Table 1, depending on the current amount and the presence of voltage application to the third electrode 51. The timing of voltage application to the third electrode 51, the timing of retrieving information stored in the magnetization reversal layer 20, and the timing of current detection are adjusted, which allows detection of the current value i. Specifically, which of three current ranges the current amount i exists in can be determined: $i<I_c$, $I_c \leq i<I'_c$, or $I'_c \leq i$.

TABLE 1

| detected current i | voltage application to third electrode | |
|---|---|---|
| | absence | presence |
| $i < I_c$ | 0 | 0 |
| $I_c \leq i < I'_c$ | 0 | 1 |
| $I'_c \leq i$ | 1 | 1 |

When a spin-injection magnetoresistance effect element of one embodiment of the invention is applied to a binary-output voltage sensor for example, the third electrode 51 is used as a probe of the voltage sensor. Before voltage measurement, information "0" for example as a logical value is recorded in advance in the magnetization reversal layer 20 of the spin-injection magnetoresistance effect element. The voltage that is applied to the third electrode 51 and should be detected is defined as "v." Furthermore, the writing current (i.e., the critical current of spin-injection magnetization reversal) when a voltage higher than "$V_3$" ($<0$) is applied to the third electrode 51 is defined as $I'_c$. The writing current (i.e., the critical current of spin-injection magnetization reversal) when a voltage equal to or lower than "$V_3$" is applied to the third electrode 51 is defined as $I_c$ ($<I'_c$). While a current I ($I_c<I<I'_c$) is passed between the first and second electrodes 34 and 44, a voltage to be detected is applied to the third electrode 51, and then the information stored in the magnetization reversal layer 20 is read out. If the read information is "0," a determination can be made that the voltage v is larger than $V_3$. If the read information is "1," a determination can be made that the voltage v is equal to or lower than $V_3$.

What is claimed is:

1. A spin-injection magnetoresistance effect element comprising:
   (A) a magnetization reversal layer that has a first face and a second face opposite to the first face, and stores information;
   (B) a first magnetization reference layer that is disposed near one end of the magnetization reversal layer in a manner of facing the first face of the magnetization reversal layer with intermediary of a first nonmagnetic film between the first magnetization reference layer and the magnetization reversal layer, the first magnetization reference layer being magnetized in a first direction;
   (C) a second magnetization reference layer that is disposed near the other end of the magnetization reversal layer in a manner of facing the first face of the magnetization reversal layer and being separated from the first magnetization reference layer with intermediary of a second nonmagnetic film between the second magnetization reference layer and the magnetization reversal layer, the second magnetization reference layer being magnetized in a second direction that is the opposite direction of the first direction;
   (D) a first electrode that is electrically coupled to the first magnetization reference layer;
   (E) a second electrode that is electrically coupled to the second magnetization reference layer; and
   (F) a third electrode that is disposed in a manner of facing the second face of the magnetization reversal layer with intermediary of an insulating film between the third electrode and the magnetization reversal layer.

2. The spin-injection magnetoresistance effect element according to claim 1, wherein injection of a spin-polarized current from the first or second electrode via the first or second magnetization reference layer, respectively, into the magnetization reversal layer sets a magnetization direction of the magnetization reversal layer to the first or second direction, to thereby write information to the magnetization reversal layer.

3. The spin-injection magnetoresistance effect element according to claim 2, wherein
a logical value of information written to the magnetization reversal layer is controlled by a direction of a current flowing between the first and second electrodes.

4. The spin-injection magnetoresistance effect element according to claim 2, wherein
a voltage is applied to the third electrode in writing of information to the magnetization reversal layer.

5. The spin-injection magnetoresistance effect element according to claim 4, wherein
the magnetization reversal layer is grounded in writing of information to the magnetization reversal layer.

6. The spin-injection magnetoresistance effect element according to claim 1, wherein
the first magnetization reference layer, the first nonmagnetic film and the magnetization reversal layer form a multi-layer structure having a tunnel magnetoresistance (TMR) effect.

7. The spin-injection magnetoresistance effect element according to claim 6, wherein
the second magnetization reference layer, the second nonmagnetic film and the magnetization reversal layer form a multi-layer structure having a giant magnetoresistance (GMR) effect.

8. The spin-injection magnetoresistance effect element according to claim 1, wherein
a first antiferromagnetic layer is formed between the first magnetization reference layer and the first electrode, and
a second antiferromagnetic layer is formed between the second magnetization reference layer and the second electrode.

9. The spin-injection magnetoresistance effect element according to claim 1, wherein
either one of the first and second magnetization reference layers has a synthetic ferri-magnetic structure.

10. The spin-injection magnetoresistance effect element according to claim 1, wherein
either one of the first and second magnetization reference layers has a magnetostatically coupled structure.

11. The spin-injection magnetoresistance effect element according to claim 1, wherein
the first magnetization reference layer has a synthetic ferri-magnetic structure, and the second magnetization reference layer has a synthetic ferro-magnetic structure.

* * * * *